United States Patent
Park et al.

(10) Patent No.: US 12,190,988 B2
(45) Date of Patent: Jan. 7, 2025

(54) DATA CODING DEVICE, MEMORY CONTROLLER, AND STORAGE DEVICE

(71) Applicant: SK hynix Inc., Gyeonggi-do (KR)

(72) Inventors: Ie Ryung Park, Gyeonggi-do (KR); Dong Sop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 6 days.

(21) Appl. No.: 18/094,398

(22) Filed: Jan. 9, 2023

(65) Prior Publication Data

US 2024/0038317 A1    Feb. 1, 2024

(30) Foreign Application Priority Data

Jul. 27, 2022   (KR) .......................... 10-2022-0092853

(51) Int. Cl.
    *G11C 7/10*      (2006.01)
    *G11C 29/12*     (2006.01)

(52) U.S. Cl.
    CPC ...... *G11C 7/1006* (2013.01); *G11C 29/12005* (2013.01); *G11C 29/1201* (2013.01); *G11C 2029/1204* (2013.01)

(58) Field of Classification Search
    CPC .................................................. G11C 7/1006
    See application file for complete search history.

(56) References Cited

U.S. PATENT DOCUMENTS

| | | | | |
|---|---|---|---|---|
| 5,873,112 A | * | 2/1999 | Norman | G11C 16/10 257/E27.103 |
| 10,318,438 B1 | * | 6/2019 | Hershman | G06F 12/1433 |
| 10,417,171 B1 | * | 9/2019 | Sarmah | G06F 1/3253 |
| 10,529,417 B2 | * | 1/2020 | Kanno | G11C 16/10 |
| 2010/0002504 A1 | * | 1/2010 | Kim | G11C 16/10 365/185.18 |
| 2010/0052729 A1 | * | 3/2010 | Brox | G06F 13/4239 365/174 |
| 2010/0057971 A1 | * | 3/2010 | Kao | G06F 13/4072 710/305 |
| 2012/0206280 A1 | * | 8/2012 | Abbasfar | H04L 25/4915 341/51 |
| 2013/0082735 A1 | * | 4/2013 | Nakamura | H03K 19/215 326/55 |

(Continued)

FOREIGN PATENT DOCUMENTS

| | | |
|---|---|---|
| KR | 10-2000-0009381 A | 2/2000 |
| KR | 10-2012-0038282 A | 4/2012 |

(Continued)

*Primary Examiner* — Joseph D Torres
(74) *Attorney, Agent, or Firm* — IP & T GROUP LLP

(57) ABSTRACT

A data coding device may include a raw data storage configured to store raw data of which the total number of bits is 2N, a previous data storage configured to store previous data output before the raw data, a counter configured to count the number of reference data bits included in the raw data, and a data output circuit configured to invert and output the raw data according to a comparison result with the previous data when the number of reference data bits included in the raw data is N, and invert and output the raw data according to the number of reference data bits included in the raw data when the number of reference data bits included in the raw data is not N.

16 Claims, 22 Drawing Sheets

(56) References Cited

U.S. PATENT DOCUMENTS

| | | | | |
|---|---|---|---|---|
| 2013/0103891 A1* | 4/2013 | Sharon | ............... | G06F 12/0246 |
| | | | | 711/E12.001 |
| 2014/0258794 A1* | 9/2014 | Yang | ..................... | G11C 16/26 |
| | | | | 714/704 |
| 2017/0221569 A1* | 8/2017 | Akamine | ............... | G11C 16/26 |
| 2018/0018104 A1* | 1/2018 | Farahani | ............. | G11C 11/1693 |
| 2021/0240389 A1 | 8/2021 | Sela et al. | | |
| 2022/0179740 A1* | 6/2022 | Roy | ..................... | G11C 29/42 |
| 2024/0038317 A1* | 2/2024 | Park | ..................... | G11C 7/1006 |

FOREIGN PATENT DOCUMENTS

| | | |
|---|---|---|
| KR | 10-2015-0116174 A | 10/2015 |
| KR | 10-2016-0054494 A | 5/2016 |
| KR | 10-2016-0107400 A | 9/2016 |
| KR | 10-2017-0032144 A | 3/2017 |
| KR | 10-2019-0004400 A | 1/2019 |
| KR | 10-2019-0091816 A | 8/2019 |
| KR | 10-2019-0110306 A | 9/2019 |
| KR | 10-2020-0014241 A | 2/2020 |
| KR | 10-2208497 B1 | 1/2021 |
| KR | 10-2021-0041158 A | 4/2021 |
| KR | 10-2021-0093362 A | 7/2021 |

* cited by examiner

FIG. 8

| ENABLE | LUN | START LA | END LA |
|--------|-----|----------|--------|
| 1 | 0 | 30 | 50 |
| 1 | 0 | 50 | 60 |
| 0 | 0 | 70 | 80 |
| ⋮ | ⋮ | ⋮ | ⋮ |
| 1 | 6 | 20 | 60 |
| 0 | 7 | 50 | 90 |

DATA CODING DEVICE, MEMORY CONTROLLER, AND STORAGE DEVICE

CROSS-REFERENCE TO RELATED APPLICATION

The present application claims priority under 35 U.S.C. § 119(a) to Korean patent application number 10-2022-0092853, filed on Jul. 27, 2022, in the Korean Intellectual Property Office, the entire disclosure of which is incorporated herein by reference.

BACKGROUND

1. Field of Invention

The present disclosure relates to a data coding device, a memory controller, and a storage device.

2. Description of Related Art

Volatile memory devices such as DRAM lose all stored information when power is turned off, but a nonvolatile memory device retains information even when power is turned off. Therefore, nonvolatile memory devices are used in many portable digital products. For example, in the case of a personal computer (PC) using DRAM, information is stored in a hard disk when power is turned off.

However, portable products that are small and light may not be able to use hard disks because of their relatively large size. Accordingly, the nonvolatile memory industry has become very competitive in its efforts to design nonvolatile memory that is small in size. And, this competitiveness has translated into increased competition among manufacturers of mobile products (e.g., memory cards, digital cameras, voice/audio recorders, networking devices, cellular phones, and the like).

Given these considerations, there is a need to provide a memory controller which is considered optimal for nonvolatile memory. In particular, a need exists for a memory controller that is capable of improving performance and power efficiency of a storage device including the nonvolatile memory, while at the same time has a reduced size.

SUMMARY

An embodiment of the present disclosure provides a data coding device, a memory controller, and a storage device capable of further improving performance and power efficiency of the storage device and further reducing the area.

According to an embodiment of the present disclosure, a data coding device may include a raw data storage configured to store raw data having a total number of bits of 2N; a previous data storage configured to store previous data output before the raw data; a counter configured to count a number of reference data bits included in the raw data; and a data output circuit configured to: invert and output the raw data according to a comparison result with the previous data when the number of reference data bits included in the raw data is N, and invert and output the raw data according to the number of reference data bits included in the raw data when the number of reference data bits included in the raw data is not N.

According to an embodiment of the present disclosure, a memory controller may comprise a host interface configured to receive data from an external host; and a memory interface configured to provide conversion data, obtained by converting the received data, to an external memory device. The memory interface may be configured to receive raw data having a total number of bits is 2N, invert and output the raw data according to a comparison result with previous data output before the raw data when a number of reference data bits in the raw data is N, and output the conversion data by inverting the raw data according to the number of reference data bits included in the raw data when the number of reference data bits included in the raw data is not N.

According to an embodiment of the present disclosure, a storage device may include a memory device; and a memory controller configured to provide conversion data obtained by converting data received from an external host to the memory device. The memory controller may be configured to receive raw data having a total number of bits is 2N, invert and output the raw data according to a comparison result with previous data output before the raw data when a number of reference data bits included in the raw data is N, and output the conversion data by inverting the raw data according to the number of reference data bits included in the raw data when the number of reference data bits included in the raw data is not N.

According to an embodiment of the present disclosure, a method for operating a memory controller may include receiving, from an external host, raw data having a total number of bits is 2N, converting the raw data by selectively inverting: according to a comparison result with previous data output before the raw data when a number of reference data bits in the raw data is N, and according to the number of reference data bits included in the raw data when the number of reference data bits included in the raw data is not N; and providing converted data to the memory device.

According to the present technology, a data coding device, a memory controller, and a storage device capable of further improving performance and power efficiency of the storage device and further reducing the area are provided.

BRIEF DESCRIPTION OF THE DRAWINGS

FIG. 8 illustrates an example of information on an access restricted area stored in a storage device.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Figure 1:
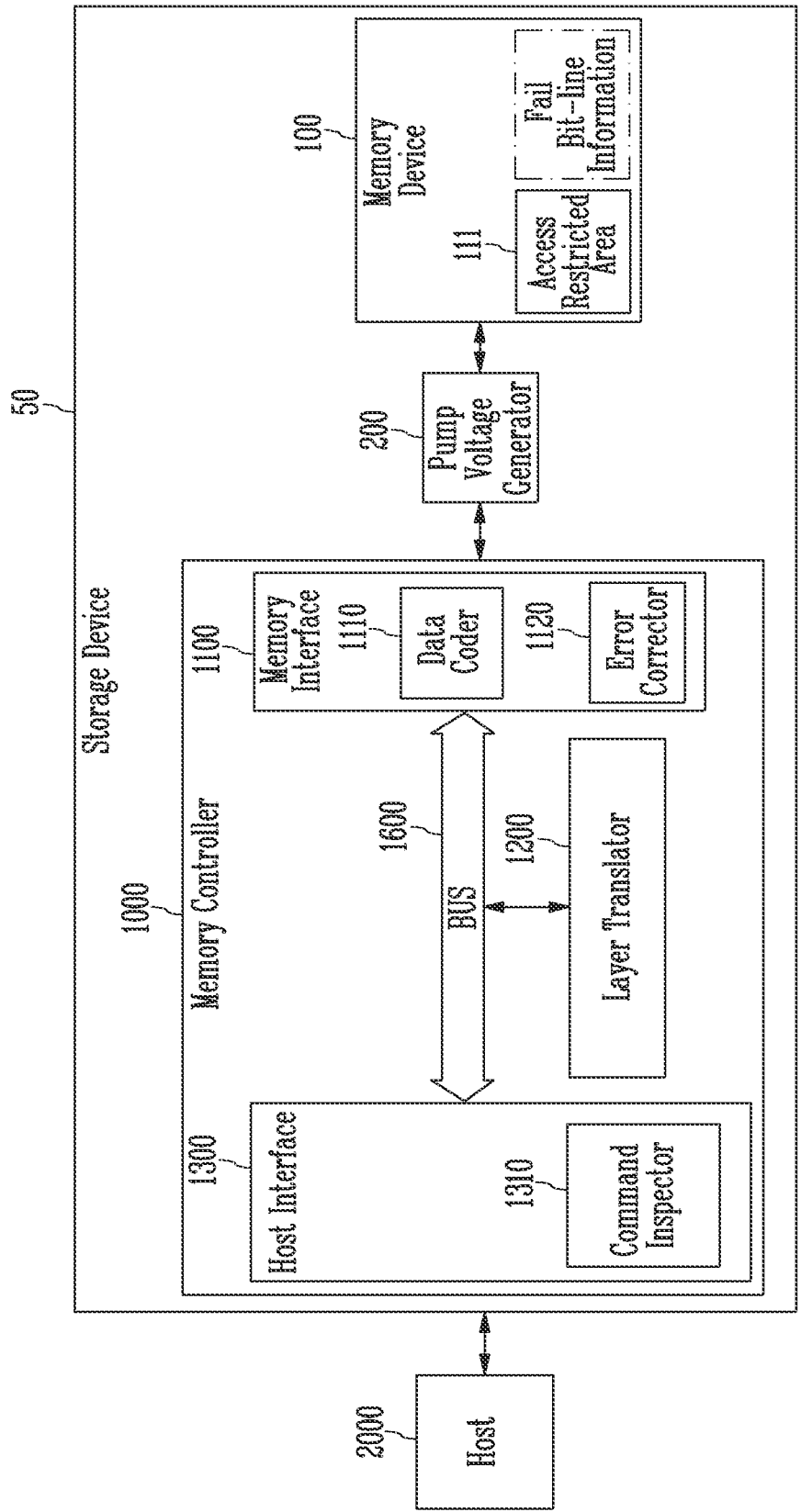
FIG. 1 illustrates an embodiment of a storage device.

FIG. 1 is a diagram illustrating an embodiment of a storage device 50 that may include a memory device 100, a pump voltage generator 200, and a memory controller 1000.

The memory controller 1000 may include a host interface 1300, a memory interface 1100, and a layer translator 1200. The memory controller 1000 may control overall operation of the storage device 50. When power is applied to the storage device 50, the memory controller 1000 may execute firmware (FW). When the memory device 100 is a flash memory device, the memory controller 1000 may execute firmware such as a flash translation layer (FTL) for controlling communication between a host 2000 and the memory device 100.

The host interface 1300 may be configured of firmware corresponding to a host interface layer (HIL) that manages an interface with the host 2000, and hardware for implementing the firmware. The host interface 1300 may communicate with the host 2000. In an embodiment, the host interface 1300 may communicate with the host 2000 using at least one of various communication methods. Examples include a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), an load reduced DIMM (LRDIMM).

The host interface 1300 may provide requests from the host 2000 to the layer converter 1200. The host interface 1300 may provide to the host 2000 a result of performing the requests received from the host 2000. The host interface 1300 may include a command inspector 1310. In operation, the host interface 1300 may process an access request from the host 2000 to an access restricted area 111 within the memory device 100 based on information generated by the command inspector 1310.

The memory interface 1100 may be configured of firmware corresponding to a memory interface layer (MIL) that manages an interface with the memory device 100 and hardware for implementing the firmware. The memory interface 1100 may communicate with the memory device 100. The memory interface 1100 may provide commands corresponding to requests received from the layer converter 1200 to the memory device 100. The memory interface 1100 may receive a result of commands performed by the memory device.

The memory interface 1100 may include a data coder 1110 which may encode data received from the layer converter 1200 based on a previously stored algorithm or code. Encoded data may be provided to the memory device 100. Alternatively, data may be determined by decoding data provided from the memory device 100.

In addition, the memory interface 1100 may include an error corrector (i.e., error checking and correction (ECC) unit) 1120. The error corrector 1120 may perform an error correction operation on the memory device 100 according to a previously stored error correction code. In an embodiment, the error corrector 1120 may include an ECC encoder and an ECC decoder. The error corrector 1120 may perform error bit correction in a predetermined error correction performance unit, for example, in a chunk unit. The ECC encoder may perform error correction encoding of data provided to the memory device 100 to generate a codeword to which a parity bit is added. The codeword may be transmitted to and stored in the memory device 100. The ECC encoder may perform encoding in the error correction performance unit. The ECC decoder may perform error correction decoding on data read from the memory device 100 and determine whether the error correction decoding is successful according to a performance result. The ECC decoder may correct an error bit of data using a parity bit. When the number of error bits is equal to or greater than a correctable error bit limit, the ECC decoder may not correct the error bits, and an error correction failure (fail) may occur.

The layer converter 1200 may be configured of firmware corresponding to a conversion layer that manages conversion between a host interface layer and a memory interface layer, such as an FTL, and hardware for implementing the firmware. The layer converter 1200 may convert a logical address included in the request from the host 2000 into a physical address. In an embodiment, the physical address may indicate a specific memory area included in the flash memory device.

In addition, the memory controller 1000 may include a bus 1600 configured to provide a channel between components of the memory controller 1000. Here, each of the components may be distinct function blocks configured to perform a specific function. One or more of the function blocks may include an intelligent property (IP) block.

The memory device 100 may store data and may operate in response to control of the memory controller 1000. The memory device 100 may include a memory cell array including a plurality of memory cells storing data. The memory cell array may include a plurality of memory blocks, and each memory block may include a plurality of memory cells. One memory block may include a plurality of pages. In an embodiment, a page may be a unit for storing data in the memory device 100 or reading data stored in the memory device 100. A memory block may be a unit for erasing data.

The memory device 100 may be, for example, a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random memory (PRAM), a magnetoresistive random access memory (MRAM), a ferroelectric random access memory (FRAM), a spin transfer torque random access memory (STT-RAM), or the like.

In an embodiment, the memory device 100 may be implemented in a three-dimensional array structure. The present disclosure may be applied not only to a flash memory device in which a charge storage layer is configured of a conductive floating gate (FG), but also to a charge trap flash (CTF) in which the charge storage layer is configured of an insulating layer. In an embodiment, each of the memory cells included in the memory device 100 may be configured as a single level cell (SLC) storing one data bit. Alternatively, each of the memory cells included in the memory device 100 may be configured as a multi-level cell (MLC) storing two data bits, a triple-level cell (TLC) storing three data bits, or a quad level cell (QLC) capable of storing four data bits. The memory device 100 is configured to receive a command and an address from the memory controller 1000 and access an area selected by the address in the memory cell array. For example, the memory device 100 may perform an operation corresponding to the command on the area selected by the address.

For example, the memory device 100 may perform a write operation (program operation), a read operation, and an erase operation. During the program operation, the memory device 100 may program data in the area selected by the address. During the read operation, the memory device 100 may read data from the area selected by the address. During the erase operation, the memory device 100 may erase data stored in the area selected by the address.

The memory device 100 may include the access restricted area 111, which may be an area in which access from an external device or system is restricted. The access restricted area 111 may be preset when the memory device is manufactured or may be designated by the host. At this time, in the access restricted area 111, both writing and reading may be restricted, or only writing may be restricted.

In addition, fail bit line information may be stored in the memory device 100. The fail bit line information may include information on failed bit lines with respect to a test operation performed during manufacturing of the memory device. An address may be allocated to the bit lines included in the memory device 100 based on the fail bit line information.

The pump voltage generator 200 may supply a pump voltage to the memory device 100. The pump voltage may be a relatively high voltage output by pumping a relatively low voltage. The pump voltage generator of the storage device 50 according to an embodiment of the present disclosure may be positioned outside of the memory device 100, rather than an inside of the memory device 100.

The host 2000 may communicate with the storage device 50 using at least one of various communication methods. Examples include a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

The storage device 50 may be manufactured as any one of various types of storage devices according to the host interface that is a communication method with the host 2000. For example, the storage device 50 may be configured as any one of an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of a package-on-package (POP), a system in package (SIP), a system on chip (SOC), a multi-chip package (MCP), a chip on board (COB), a wafer-level fabricated package (WFP), and a wafer-level stack package (WSP).

Figure 2:
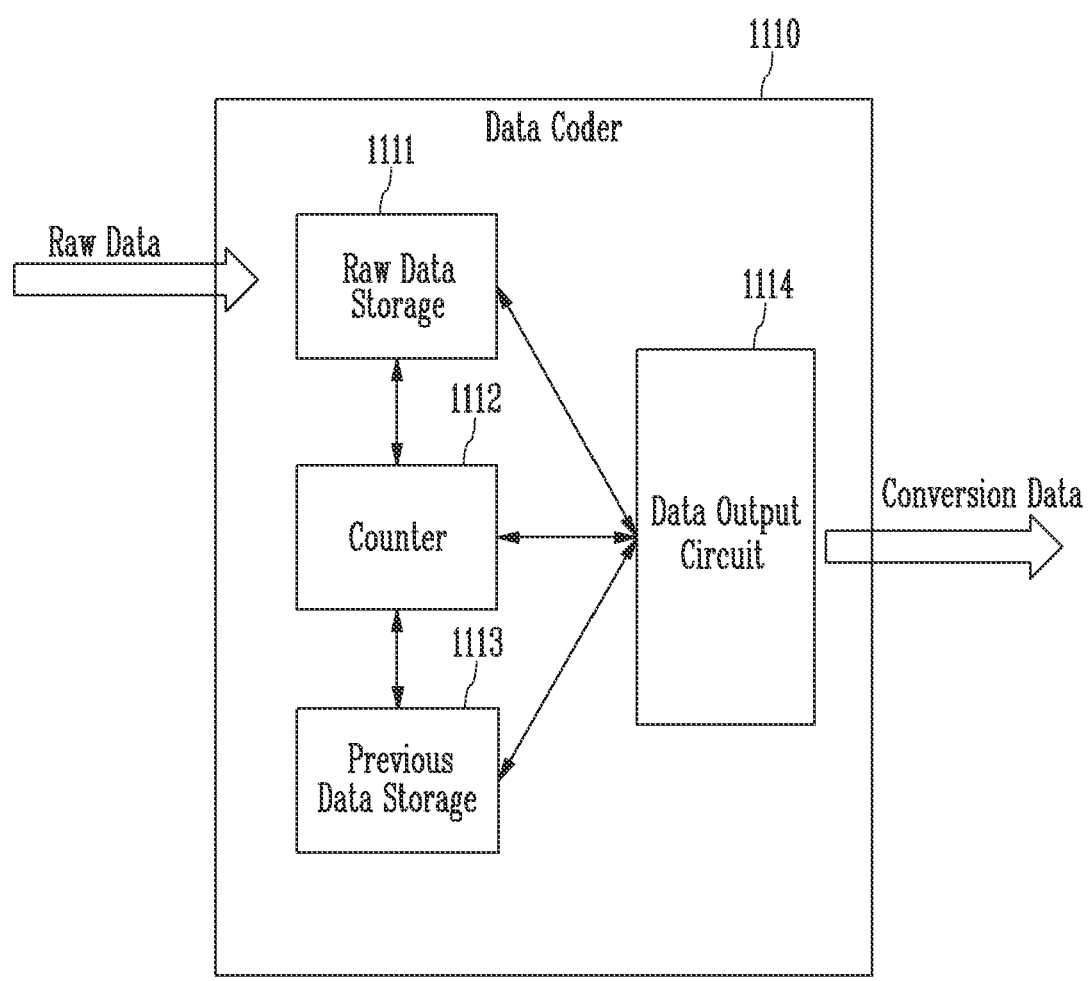
FIG. 2 illustrates an embodiment of a data coder.

FIG. 2 is a diagram illustrating an embodiment of a data coder 1110 which may include a raw data storage 1111, a counter 1112, a previous data storage 1113, and a data output circuit 1114.

The raw data storage 1111 may receive raw data Raw Data from an external source. The total number of bits of raw data may be 2N.

The counter 1112 may count the number of reference data bits included in the raw data stored in the raw data storage 1111. Power consumption of the reference data bit may be less than power consumption of a bit other than the reference data bit. In an embodiment, the reference data bit may be a low level signal.

The previous data storage 1113 may store previous data output before the raw data. For example, the previous data may refer to data input to the data coding device 1100 and output from the data coding device 1100 before the raw data. Accordingly, an output value of the data output circuit 1114 may be fed back to an input terminal of the previous data storage 1113.

The data output circuit 1114 may receive the raw data from the raw data storage 1111 and determine whether to invert the raw data. In addition, according to whether to invert the raw data, the data output circuit 1114 may invert or not invert and output the raw data. Whether to invert the raw data may be determined, for example, based on the number (or information) of bits corresponding to the reference data bit among bits included in the raw data.

In an embodiment, when the total number of bits of raw data is 2N, a determination may be made as to whether to invert data based on whether the number of bits corresponding to the reference data bit among bits included in encoded and output data (conversion data) exceeds N. For example, when the number of bits corresponding to the reference data bit among bits included in the raw data is less than N, the data output circuit 1114 may invert and output the raw data. When the number of bits corresponding to the reference data bit among the bits included in the raw data is greater than N, the data output circuit 1114 may not invert and output the raw data. The number of bits corresponding to the reference data bits may be counted by the counter 1112, and the counted number of reference data bits may be provided to the data output circuit 1114.

When the number of bits corresponding to the reference data bits among the bits included in the raw data is N, the data output circuit 1114 may determine whether to invert the data in consideration of previous data output before current raw data. The data output circuit 1114 may receive the previous data from a previous data storage 1113 to determine whether to invert the data. In an embodiment, the data output circuit 1114 may determine whether to invert the current raw data so that a bit transition (e.g., a toggle) to the current data to be output from the previous data is reduced or minimized. For example, according to an embodiment, the data output circuit 1114 may invert or not invert and output the data in a direction for further reducing power consumption through selection of an output bit and minimization of a toggle.

Figure 3:
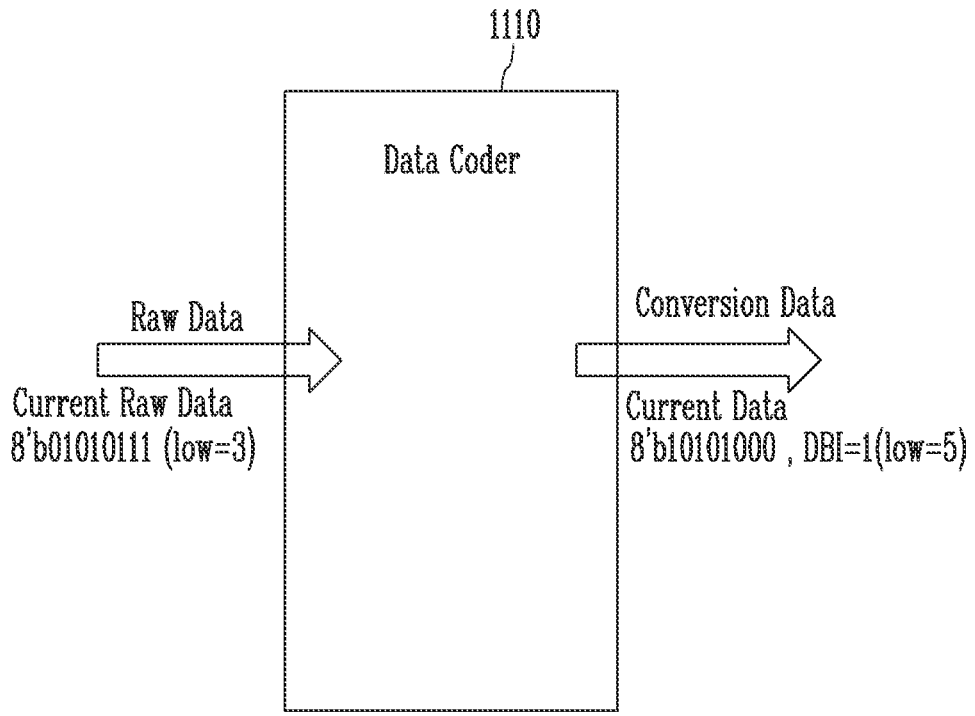
FIGS. 3 to 6 illustrate a data coding process of a data coder according to an embodiment of the present disclosure and according to a comparative example.
Figure 4:
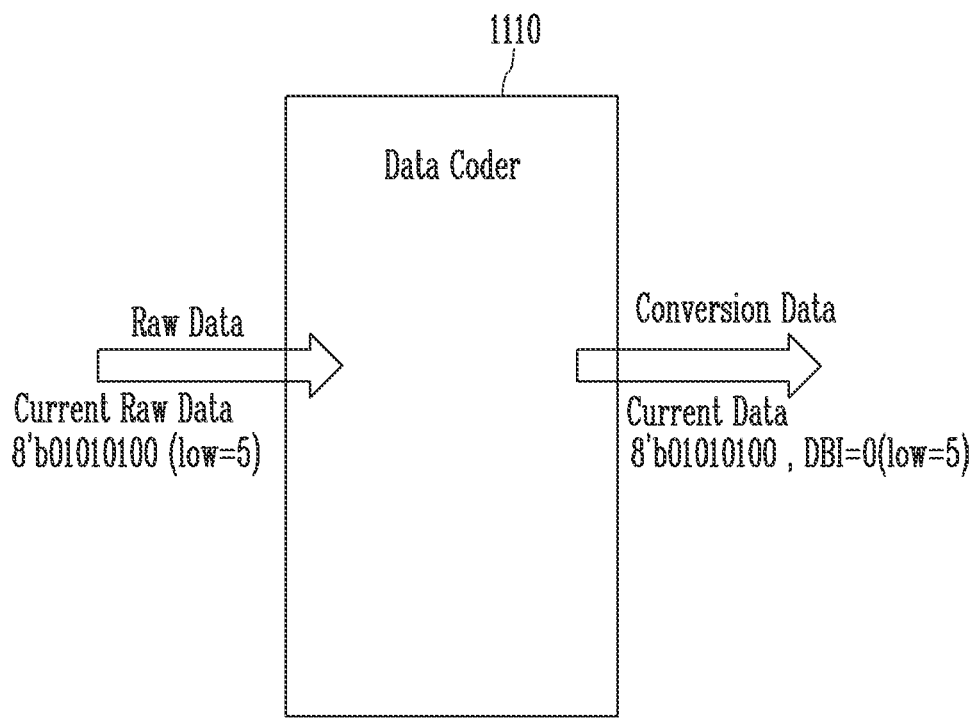
Figure 5:
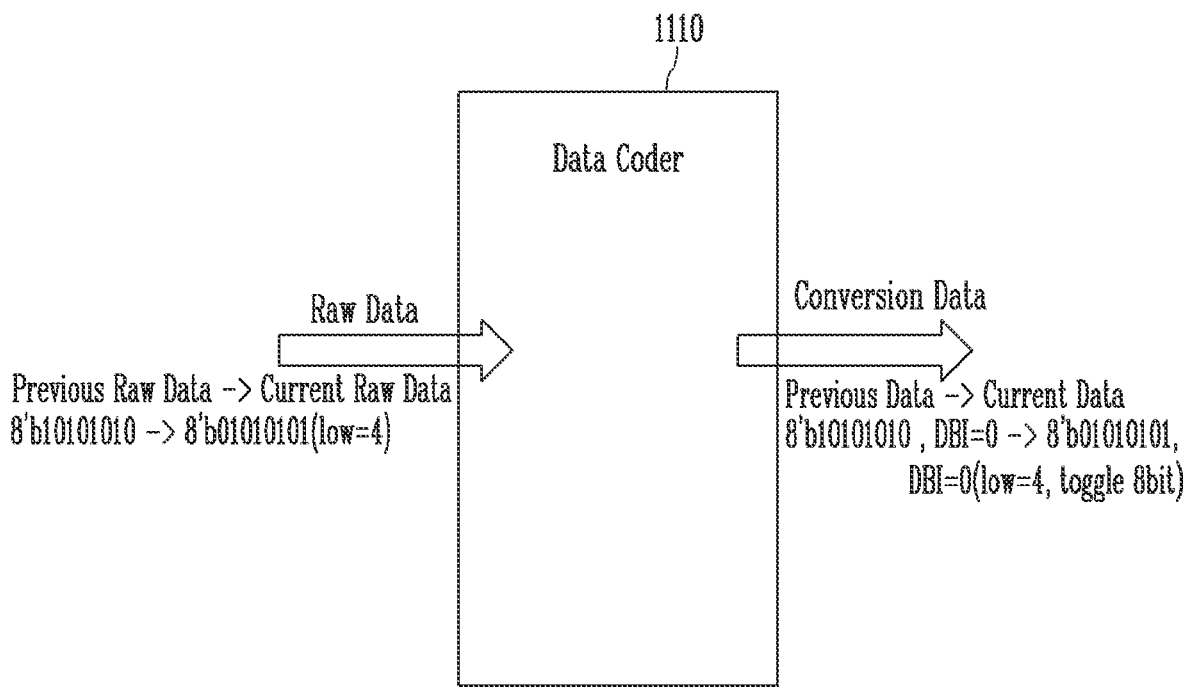
Figure 6:
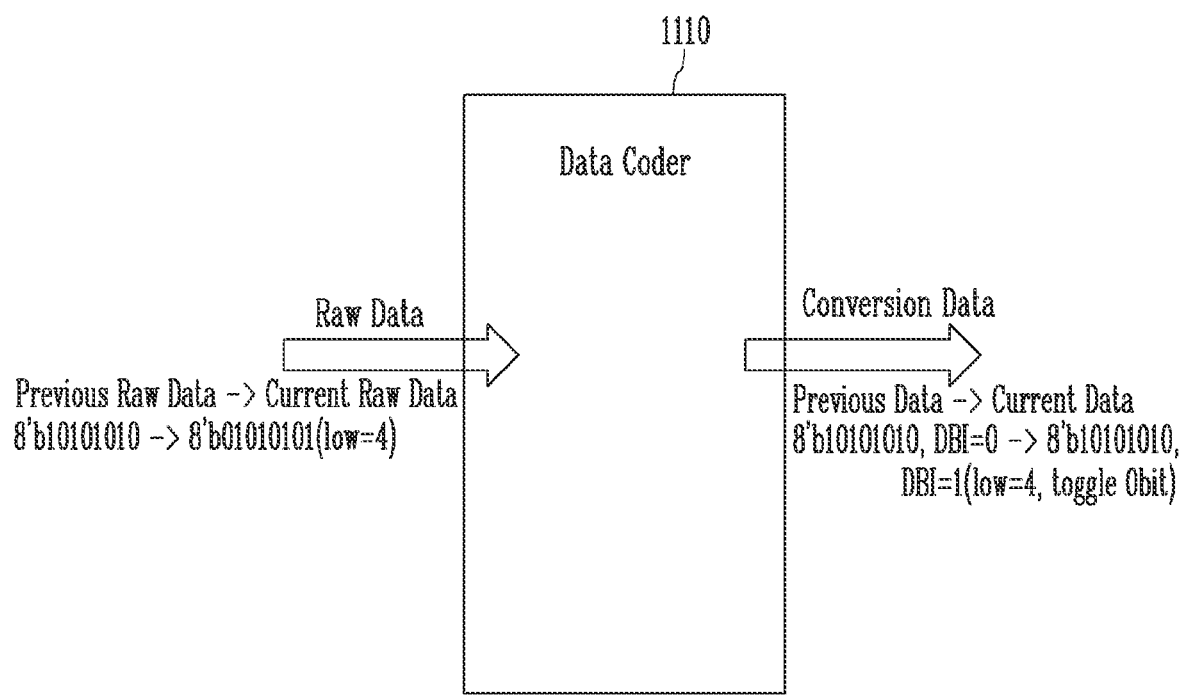

FIGS. 3 to 6 are diagrams illustrating a data coding process of a data coder according to an embodiment of the present disclosure and a comparative example. More specifically, FIGS. 3, 4, and 6 illustrates an operation of the data coder according to an embodiment of the present disclosure, and FIG. 5 illustrates an operation of a data coder according to a comparative example.

Referring to FIG. 3, the data coder 1110 may receive 8 bits of "01010111" as the raw data. At this time, the reference data bit may be 0 which is the low level signal. Thus, the number of bits corresponding to the reference data bit included in the raw data is 3. Therefore, since the number of bits corresponding to the reference data bit among the bits included in the raw data is less than 4 (which is half of the total number of bits), the data coder 1110 may determine to invert the raw data. Accordingly, the raw data may be inverted and output as "10101000". Here, the number of bits corresponding to the reference data bits included in the output conversion data is 5 exceeding 4, which is half of the total number of bits. In addition, a data flag signal DBI may be 1, which is a value indicating data inversion.

Referring to FIG. 4, the data coder 1110 may receive 8 bits of "01010100" as the raw data. At this time, the reference data bit may be 0 which is the low level signal. Thus, the number of bits corresponding to the reference data bit included in the raw data is 5. Therefore, since the number of bits corresponding to the reference data bit among the bits included in the raw data exceeds 4 (which is half of the total number of bits), the data coder 1110 may determine not to invert the raw data. Accordingly, the raw data may be output as "01010100" as is without being inverted. Here, the number of bits corresponding to the reference data bits included in the output conversion data is 5 exceeding 4, which is half of the total number of bits. In addition, the data flag signal DBI may be 0, which is a value indicating non-inversion of data.

Referring to FIG. 5, the data coder 1110 may receive 8 bits of "01010101" as the current raw data. At this time, the reference data bit may be 0 which is the low level signal. Thus, the number of bits corresponding to the reference data bit included in the raw data is 4. At this time, when it is determined whether to invert the raw data without considering previously output data, the data coder 1110 may determine to invert the raw data because the number of bits corresponding to the reference data bit among the bits included in the raw data is 4 or more (which is half of the total number of bits). Accordingly, the raw data may be inverted and output as "01010101" (current data). At this time, since previously output data (previous data) is "10101010", a toggle from the previous data to the current data may be 8 bits. As shown in FIG. 5, when it is determined whether to invert the data without considering the previously output data, the ratio of the toggle may be increased and thus unnecessary power consumption may be caused.

Referring to FIG. 6, the data coder 1110 may receive 8 bits of "01010101" as the current raw data. At this time, the reference data bit may be 0 which is the low level signal. Thus, the number of bits corresponding to the reference data bit included in the raw data is 4. At this time, the data coder 1110 according to an embodiment of the present disclosure may consider the previously output data when determining whether to invert the data. That is, since the number of bits corresponding to the reference data bit among the bits included in the raw data is 4 (which is half of the total number of bits), whether this is inverted or non-inverted, the number of bits corresponding to the reference data bit among the bits included in the output conversion data may be the same as 4. Therefore, in this case, whether to invert the raw data may be determined in consideration of the previously output data, and whether to invert the raw data may be determined so that a bit transition from the previously output data to currently output data is reduced or minimized. Since the previously output data (previous data) is "10101010" in FIG. 6, when currently input raw data is inverted, a toggle bit is 8, and when the currently input raw data is not inverted, the toggle bit is 0. Therefore, the data coder 1110 according to an embodiment of the present disclosure may determine not to invert the raw data. That is, when the conversion data (current data) output according to the data coder 1110 of FIG. 6 according to an embodiment of the present disclosure is compared with that of FIG. 5, the number of reference data bits may be the same as 4. However, since the number of toggles of FIG. 6 is significantly less than that of FIG. 5, FIG. 6 may be advantageous in terms of power consumption reduction.

Figure 7:
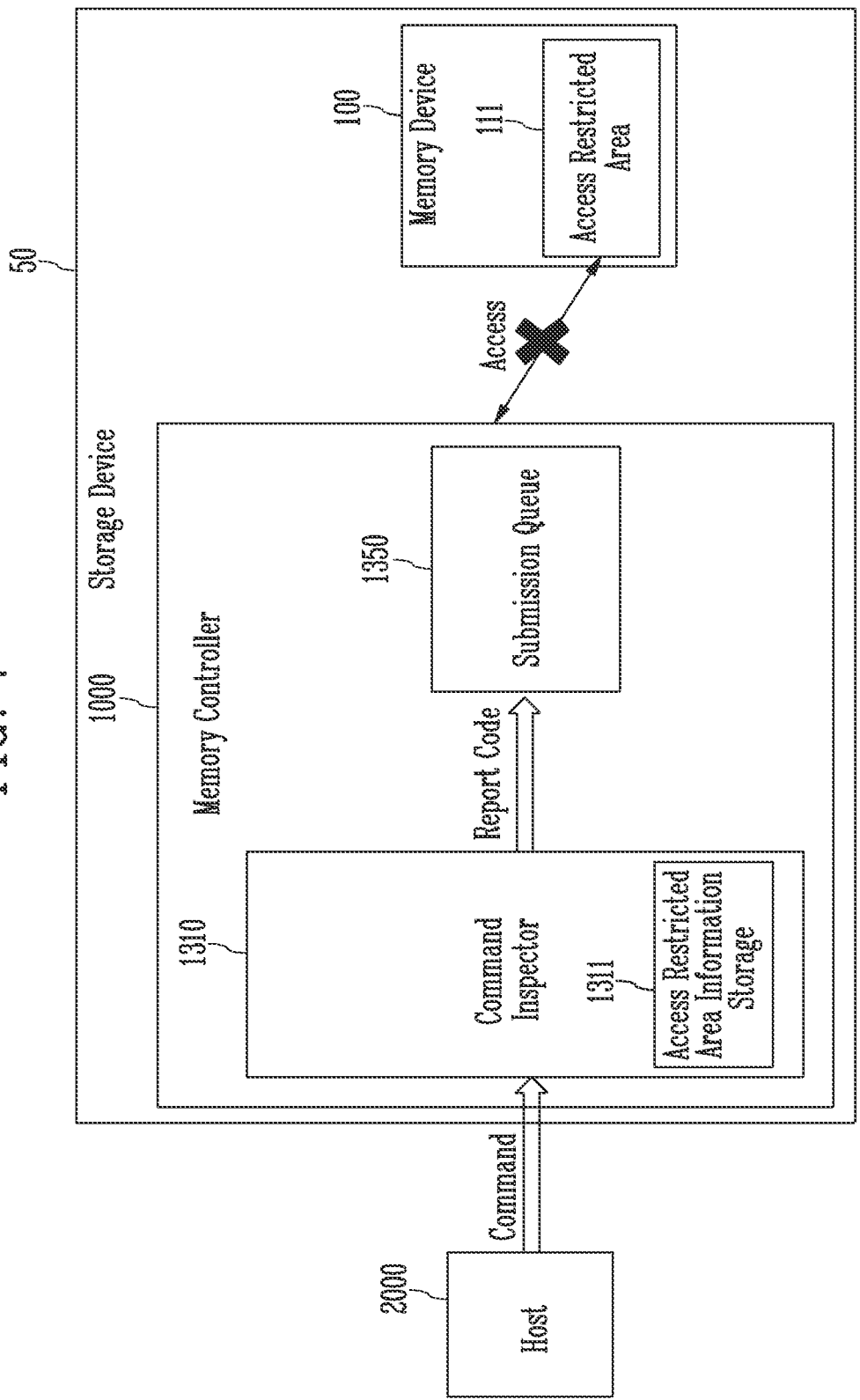
FIG. 7 illustrates an embodiment for processing a command for an access restricted area of a storage device.

FIG. 7 is a diagram illustrating processing of a command for an access restricted area of a storage device according to an embodiment of the present disclosure.

Referring to FIGS. 1 and 7, the memory device 100 may include the access restricted area 111. The access restricted area 111 may be preset or designated by the host 2000, and thus may be an area to which access is restricted. In the access restricted area 111, both write and read operations may be restricted, or only the write operation may be restricted.

The memory controller 1000 may receive a command from the host 2000. After checking the command in the command inspector 1310 with respect to the received command, the memory controller 1000 may queue the command in a submission queue 1350 in the memory controller 1000. The command inspector 1310 may include an access restricted area information storage 1311. The access restricted area information storage 1311 may include information on the access restricted area 111. For example, the information on the access restricted area 111 may be related to an address of the access restricted area. When the command is provided from the host 2000, first, the command inspector 1310 may check whether the command is one requesting access to the access restricted area 111, based on the information on the access restricted area 111 stored in the access restricted area information storage 1311. When the command from the host 2000 is the command requesting access to the access restricted area 111, the command inspector 1310 may generate information indicating that the corresponding command is one requesting access to the access restricted area 111, and may provide such information to the submission queue 1350. The information indicating that the command from the host 2000 is a command requesting access may be provided in a form of a report code of the corresponding command. The submission queue 1350 may not process and may drop the command for which the information indicating that the command from the host 2000 is the command requesting access to the access restricted area 111 is generated, and the memory controller 1000 may provide a response indicating an error to the host 2000.

FIG. 8 is an example illustrating information on an access restricted area stored in a storage device according to an embodiment of the present disclosure.

Referring to FIGS. 7 and 8, the information on the access restricted area 111 stored in the access restricted area information storage 1311 may include information on a logical address of the access restricted area for each of a plurality of LUNs (Logical Unit Numbers). In an embodiment, a plurality of discontinuous access restricted areas may be set with respect to one LUN. With respect to one LUN, one access restricted area implemented with continuous logical addresses may be configured with one monitor, and the information on the access restricted area 111 may be stored in a form of a table which is a set of a plurality of monitors. Each of the monitors may include whether a corresponding monitor is inspected (ENABLE), a corresponding LUN, and a start logical address (START LA) and a last logical address (END LA) of the access restricted area. That is, when the memory controller 1000 receives the command, the command inspector 1310 may inspect information of a monitor enabled from the access restricted area information storage 1311, and may find the same monitor as an LUN of the received command among the monitors. When a monitor indicating a logical address overlapping a logical address of the command exists among the monitors having the same LUN as the received command, the command inspector 1310 may determine that the corresponding command is the command requesting access to the access restricted area 111.

Figure 9:
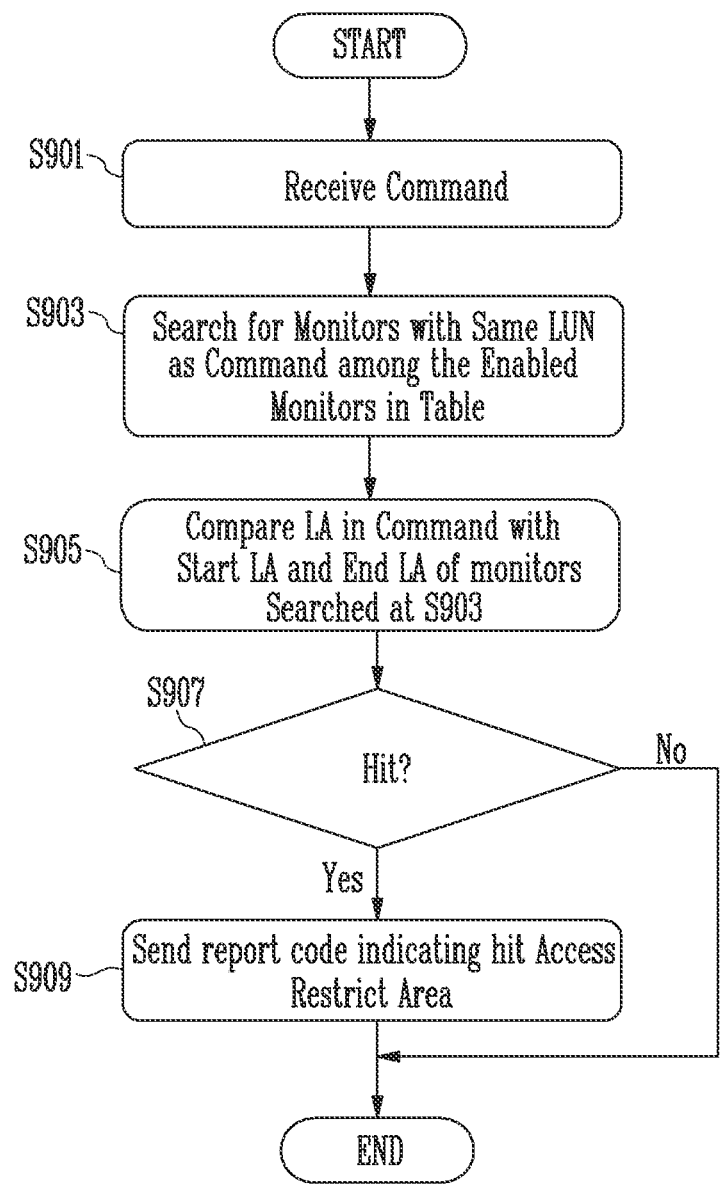
FIG. 9 illustrates an embodiment of a process of processing a command for an access restricted area of a storage device.

FIG. 9 is a flowchart illustrating a process of processing a command for an access restricted area of a storage device according to an embodiment of the present disclosure.

Referring to FIGS. 7 and 9, in operation S901, the memory controller 1000 may receive the command from the host 2000. The command inspector 1310 may inspect the enabled monitors in the table stored in the access restricted area information storage 1311, and may find the monitors having the same LUN as the LUN of the command among the monitors (operation S903). Thereafter, in operation S905, the command inspector 1310 may compare the start logical address START LA and the last logical address END LA indicated by the monitors having the same LUN as the LUN of the command with the logical address of the command. When, as a result of checking in operation S907, a range of the logical address indicated by the monitors overlaps a range of the logical address of the command (Hit), information indicating that the corresponding command hits the access restricted area (e.g., information indicating that the corresponding command is one requesting access to the access restricted area 111) may be provided to the submission queue 1350 in the form of the report code (S909).

Figure 10:
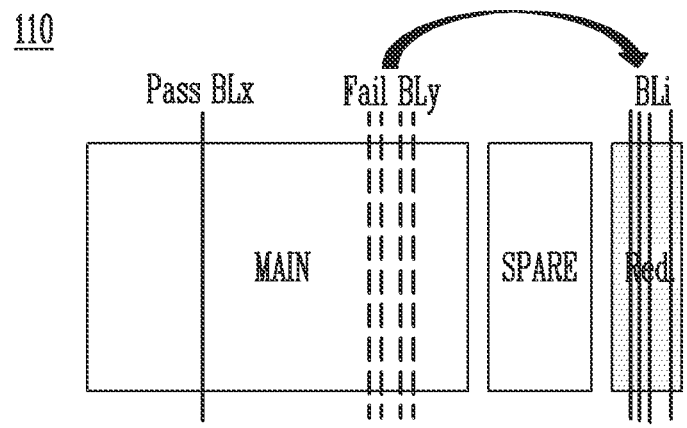
FIG. 10 illustrates one type of memory cell array which has been proposed.

FIG. 10 is a diagram illustrating a one type of memory cell array which has been proposed. Referring to FIG. 10, the memory cell array 110 of FIG. 10 includes a main area, a spare area, and a redundancy area. A bit line failed according to a test result for the main area is may be replaced with a bit line of a redundancy (Redundancy, Red.) area. However, the memory cell array of a form shown in FIG. 10 has a disadvantage in that the area of the memory cell array increases due to a separate redundancy area.

Figure 11:
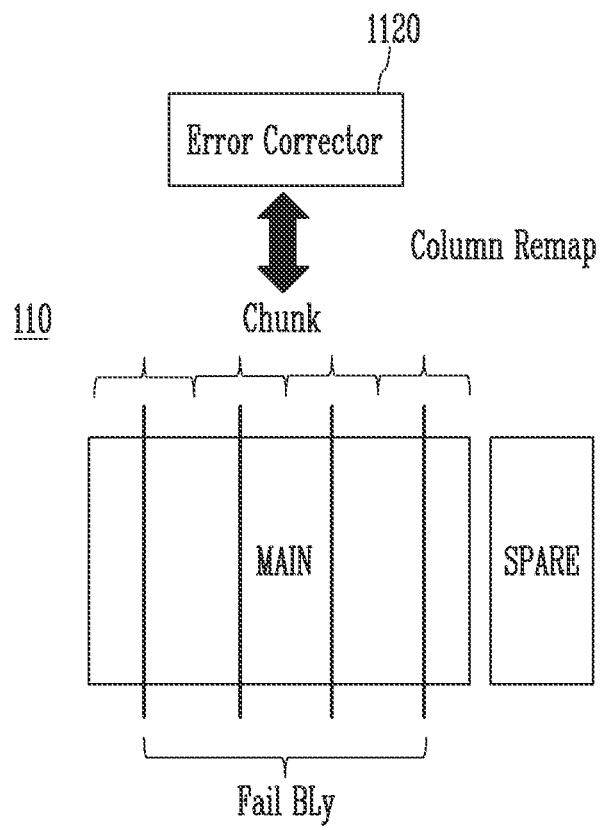
FIG. 11 illustrates an embodiment of a memory cell array of a storage device.

FIG. 11 is a diagram illustrating a memory cell array 110 of a storage device according to an embodiment of the present disclosure.

Referring to FIG. 11, the memory cell array 110 may include only a main area and a spare area and may not include a redundancy area. In this case, an error correction operation by an error corrector 1120 may not be properly performed in an area where the fail bit lines are dense. The error correction operation by the error corrector 1120 may be performed in a predetermined error correction performance unit, for example, in a chunk unit. When the number of error bits is equal to or greater than the correctable error bit limit while performing the error correction operation by the error corrector, the error corrector 1120 may not correct the error bits and an error correction failure (fail) may occur. For example, when the fail bit line by the test operation is concentrated in a specific error correction performance unit, the probability that the number of error bits in the error correction performance unit is equal to or greater than the correctable error bit limit increases, and thus the probability that an error correction failure occurs is increased. Therefore, in a case of the memory cell array 110 of FIG. 11, the address of the fail bit line may be rearranged. Specifically, the addresses of the fail bit line may be rearranged so that the number of fail bit lines included for each error correction performance unit is the same. For example, the address of the fail bit line may be rearranged so that the number of fail bit lines included in each error correction performance unit is the same, or a difference between the numbers of fail bit lines included in different error correction performance unit does not exceed 1. Information on the address of the bit lines rearranged as described above may be stored in a partial area in the memory cell array 110. The memory controller 1000 may perform an operation on the memory device 100 based on the information on the address of the stored bit lines.

Accordingly, as the redundancy area of the memory cell array 110 of FIG. 11 is removed, the area of the memory cell array 110 may be reduced, and the probability that the error correction failure occurs during the error correction operation on the memory cell array 110 may not increase.

Figure 12:
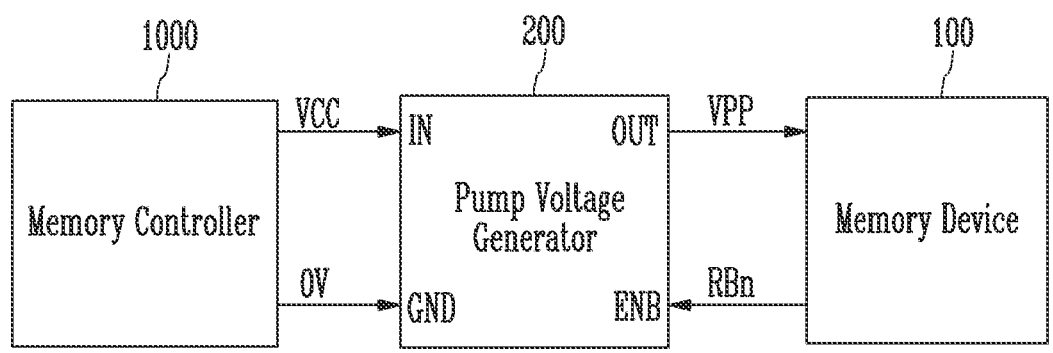
FIG. 12 illustrates an embodiment of a pump voltage generator of a storage device.

FIG. 12 is a diagram illustrating a pump voltage generator of a storage device according to an embodiment of the present disclosure.

Referring to FIG. 12, the pump voltage generator 200 may receive an input voltage $V_{CC}$ or a reference (e.g., ground) voltage GND under control of the memory controller 1000. The pump voltage generator 200 may generate a pump voltage $V_{PP}$ based on such input values and may supply the pump voltage $V_{PP}$ to the memory device 100. In addition, the pump voltage generator 200 may receive a ready busy signal $RB_n$ from the memory device 100 and may determine whether to generate the pump voltage $V_{PP}$ according to the received ready busy signal. For example, in a case where the ready busy signal is at a low level (that is, in a case where the ready busy signal indicates that the memory device is in a busy state), the case means that an operation is in progress in the memory device. Therefore, since an operation voltage is to be used for the memory device, the pump voltage generator 200 may generate the pump voltage $V_{PP}$ and supply the pump voltage $V_{PP}$ to the memory device 100. On the other hand, in a case where the ready busy signal is at a high level (e.g., in a case where the ready busy signal indicates that the memory device is in a ready state), since the operation voltage may not be used for the memory device, the pump voltage generator 200 may not generate the pump voltage, an output of the pump voltage generator 200 is shut down, and only a reduced or minimum current flows in the pump voltage generator 200. That is, since the pump voltage generator 200 of the storage device 50 according to an embodiment of the present disclosure is positioned outside the memory device 100, the area of the memory device 100 may not be unnecessarily increased. In addition, by generating the pump voltage according to the ready busy signal received from the memory device 100, the problem that a pump voltage is unnecessarily generated (and thus a current is leaked even in a case where the memory device 100 is not operated) may be prevented.

Figure 13:
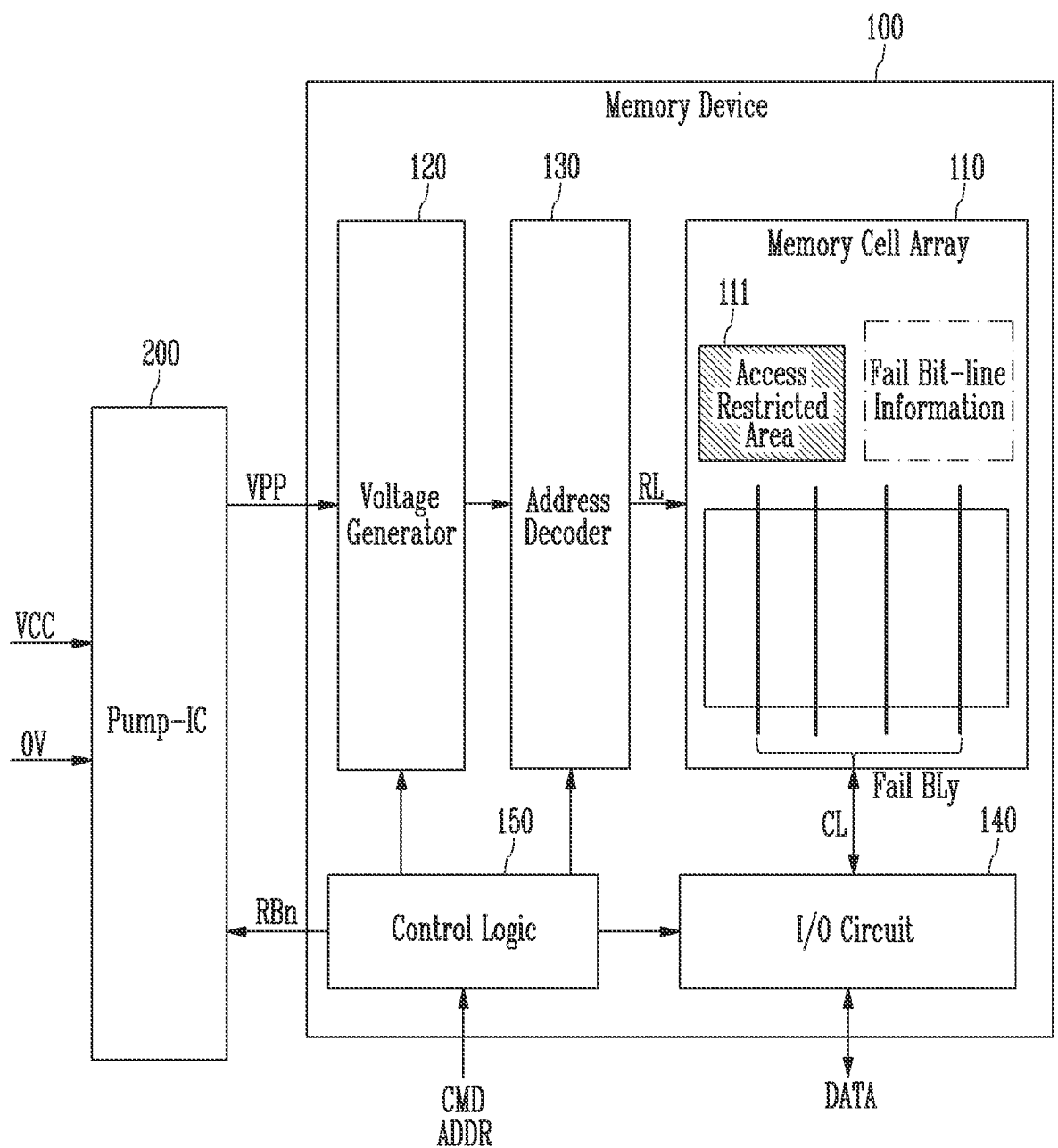
FIG. 13 illustrates an embodiment of a pump voltage generator and a memory device in a storage device.

FIG. 13 is a diagram illustrating a pump voltage generator 200 and a memory device 100 in a storage device 50 according to an embodiment of the present disclosure. Referring to FIGS. 1 and 13, the storage device 50 may include the pump voltage generator 200 and the memory device 100.

The memory device 100 may include a memory cell array 110, a voltage generator 120, an address decoder 130, an input/output circuit 140, and a control logic 150. The memory cell array 110 may include a plurality of memory blocks connected to the address decoder 130 through row lines RL. The memory blocks may be connected to the input/output circuit 140 through column lines CL. In an embodiment, the row lines RL may include word lines, source select lines, and drain select lines. In an embodiment, the column lines CL may include bit lines. At this time, an address of the bit lines may be rearranged so that bit lines Fail BLy on which the test operation is failed are uniformly included for each error correction performance unit. The error correction performance unit may be a preset unit in which the error corrector 1120 performs error correction. Information on the address of the bit lines rearranged described above may be included in the memory cell array 110.

In an embodiment, the memory cell array 110 may include one or more memory dies. Each memory die may include one or more planes including one or more memory blocks. In addition, a plurality of memory blocks included in the memory cell array 110 may be grouped into two or more super blocks. A super block may be a unit in which the control logic 150 manages the plurality of memory blocks BLK included in the memory cell array 110. One super block may be (a) a set of memory blocks in which a read operation, a write operation, and/or the like are/is performed simultaneously or at the same time, or the read operation, the write operation, and/or the like are/is performed in association with each other or in relation to each other, (b) a set of memory blocks in which the read operation, the write operation, and/or the like are/is performed with respect to one command, or (c) a set of memory blocks in which the read operation, the write operation, and/or the like are/is performed in association with each other or performed simultaneously in the memory cell array 110. In addition, from a management or operational point of view among the plurality of memory blocks, a group of memory blocks that are distinguished from each other may be referred to as the super block.

Each of the plurality of memory blocks BLK1 to BLKi may include a plurality of memory cells. In an embodiment, the plurality of memory cells may be nonvolatile memory cells. Memory cells connected to the same word line among the plurality of memory cells may be defined as one physical page. Thus, the memory cell array may include a plurality of physical pages. Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array 110 may include the access restricted area 111. The access restricted area may be an area in which external access is restricted. When the memory controller 1000 receives the command requesting access to the access restricted area 111, the memory controller 1000 may not process the command.

In an embodiment, the voltage generator 120, the address decoder 130, and the input/output circuit 140 may be collectively referred to as a peripheral circuit. The peripheral circuit may drive the memory cell array 110 under control of the control logic 150. The peripheral circuit may drive the memory cell array 110 to perform a program operation, a read operation, and an erase operation.

The voltage generator 120 is configured to generate a plurality of operation voltages using the pump voltage supplied from the pump voltage generator 200. The voltage generator 120 operates in response to the control of the control logic 150.

As an embodiment, the voltage generator 120 may generate an internal power voltage by regulating the pump voltage supplied from the pump voltage generator 200. The internal power voltage generated by the voltage generator 120 is used as an operation voltage of the memory device 100.

As an embodiment, the voltage generator 120 may generate the plurality of operation voltages using an external power voltage or an internal power voltage. The voltage generator 120 may be configured to generate various voltages for the memory device 100. For example, the voltage generator 120 may generate a plurality of erase voltages, a plurality of program voltages, a plurality of pass voltages, a plurality of selected read voltages, and a plurality of unselected read voltages.

The plurality of generated operation voltages may be supplied to the memory cell array 110 by the address decoder 130.

The address decoder 130 is connected to the memory cell array 110 through the row lines RL. The address decoder 130 is configured to operate in response to the control of the control logic 150. The address decoder 130 may receive an address ADDR from the control logic 150 and may decode a block address among the received addresses ADDR. The address decoder 130 selects at least one memory block among the memory blocks according to the decoded block address. The address decoder 130 may decode a row address among the received addresses ADDR. The address decoder 130 may select at least one word line among word lines of a selected memory block according to the decoded row address. In an embodiment, the address decoder 130 may decode a column address among the received addresses ADDR. The address decoder 130 may connect the input/output circuit 140 and the memory cell array 110 to each other according to the decoded column address.

In one embodiment, the address decoder 130 may include components such as a row decoder, a column decoder, and an address buffer.

The input/output circuit 140 may include a plurality of page buffers which may be connected to the memory cell array 110 through the bit lines. During the program operation, data may be stored in selected memory cells according to data stored in the plurality of page buffers. The data input through the input/output circuit 140 may be data converted by the data coder 1110.

During the read operation, the data stored in the selected memory cells may be sensed through the bit lines, and the sensed data may be stored in the page buffers.

The control logic 150 may control the address decoder 130, the voltage generator 120, and the input/output circuit 140. The control logic 150 may operate in response to a command CMD transmitted from an external device. The control logic 150 may generate control signals in response to the command CMD and the address ADDR to control the peripheral circuits.

The pump voltage generator 200 may receive the input voltage $V_{CC}$ or the ground voltage GND under control of the memory controller 1000, and the pump voltage generator 200 may generate the pump voltage $V_{PP}$ based on such input values and supply the pump voltage $V_{PP}$ to the memory device 100. In addition, the pump voltage generator 200 may receive a ready busy signal $RB_n$ from the memory device 100, and may determine whether to generate the pump voltage $V_{pp}$ according to the received ready busy signal.

Figure 14:
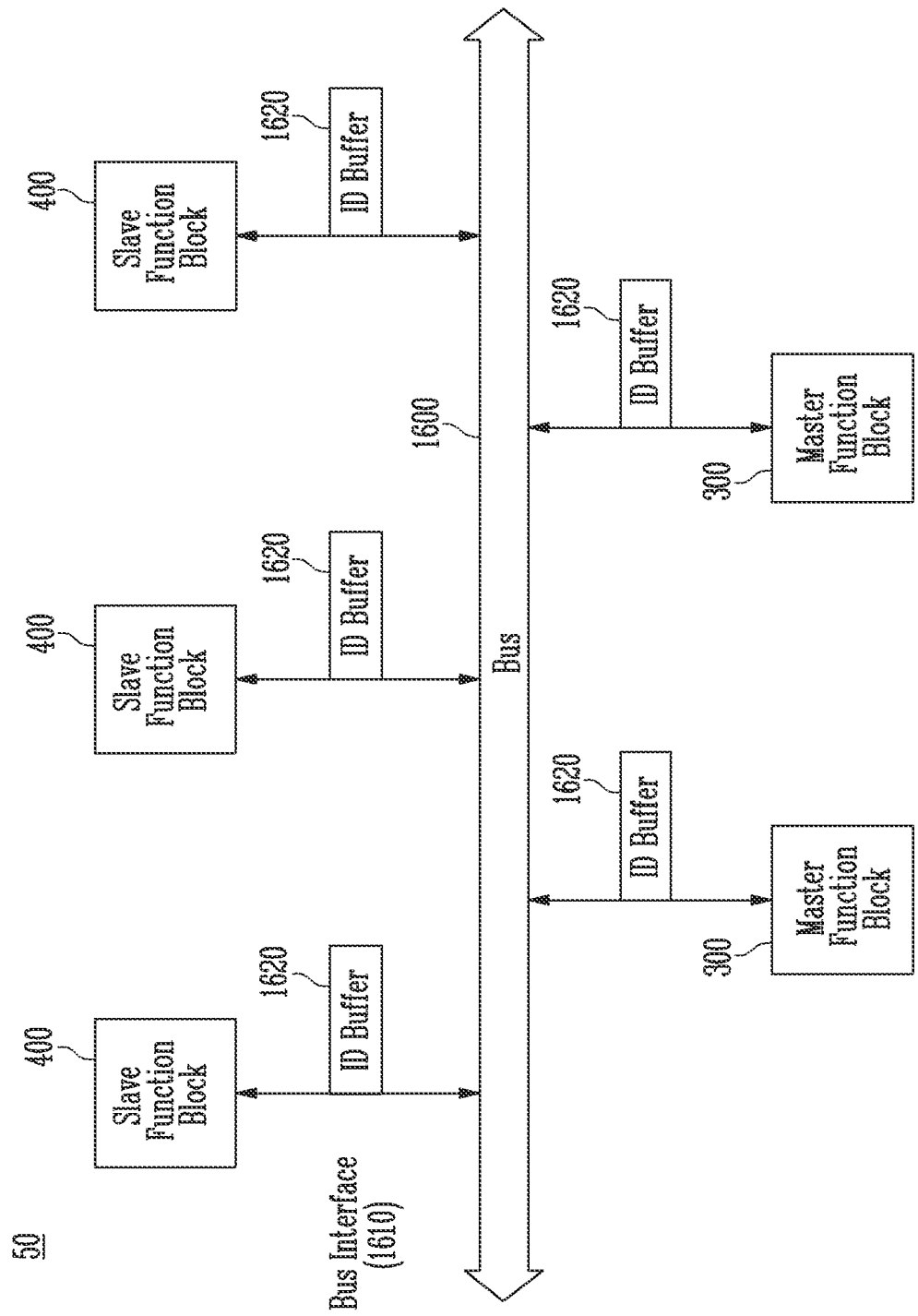
FIG. 14 illustrates an embodiment of a storage device that is based on a bus.

FIG. 14 is a diagram illustrating a storage device according to an embodiment of the present disclosure based on a bus.

Referring to FIG. 14, the storage device may include a plurality of function blocks. The function block may be, for example, an intelligent property (IP) block. In one embodiment, the function block may be a master function block 300 or a slave function block 400.

The master function block 300 is one that generates a command, and the slave function block 400 is one that receives the command generated in the master function block 300 or a function block that becomes a target of the command generated in the master function block 300. That is, a function block that is a subject for generating the command may be the master function block 300, and a function block that becomes the target of the generated command may be the slave function block 400. Therefore, a specific function block that was the master function block 300 may become the slave function block 400 in some cases, and a specific function block that was the slave function block 400 may become the master function block 300 in some cases.

A bus 1600 may serve as an arbiter and a decoder, and a plurality of master function blocks 300 and a plurality of slave function blocks 400 may be connected to the bus 1600. More specifically, the plurality of master function blocks 300 and the plurality of slave function blocks 400 may be connected to the bus 1600 through a bus interface 1610.

The bus 1600 receives address information and control information from the master function block having bus ownership among the plurality of master function blocks 300 and transmits a data processing preparation request to the slave function block 400. After requested data processing is performed in the slave function block 400, the bus 1600 may provide a response thereto to the corresponding master function block 300.

At this time, the bus 1600 may perform communication between the plurality of master function blocks 300 and the plurality of slave function blocks 400 according to a predetermined standard, e.g., advanced extensible interface (AXI) protocol standard. In order to perform functions supported by an AXI protocol, each of function blocks may have a transaction ID. However, it is possible that a transaction ID bit width of each of the master function blocks 300 and a transaction ID bit width of the slave function block 400 may not match.

At this time, the respective bus interfaces 1610 may include ID buffers 1620 in which a transaction ID of each of connected function blocks may be temporarily stored. The transaction ID stored in each of the ID buffers 1620 may be converted to have a preset bit width in the ID buffers 1620 and output. At this time, an ID output from the ID buffer 1620 and used for communication through the bus is defined as the bus ID. All bus IDs output through each of the ID buffers 1620 may have the same bit width.

Figure 15:
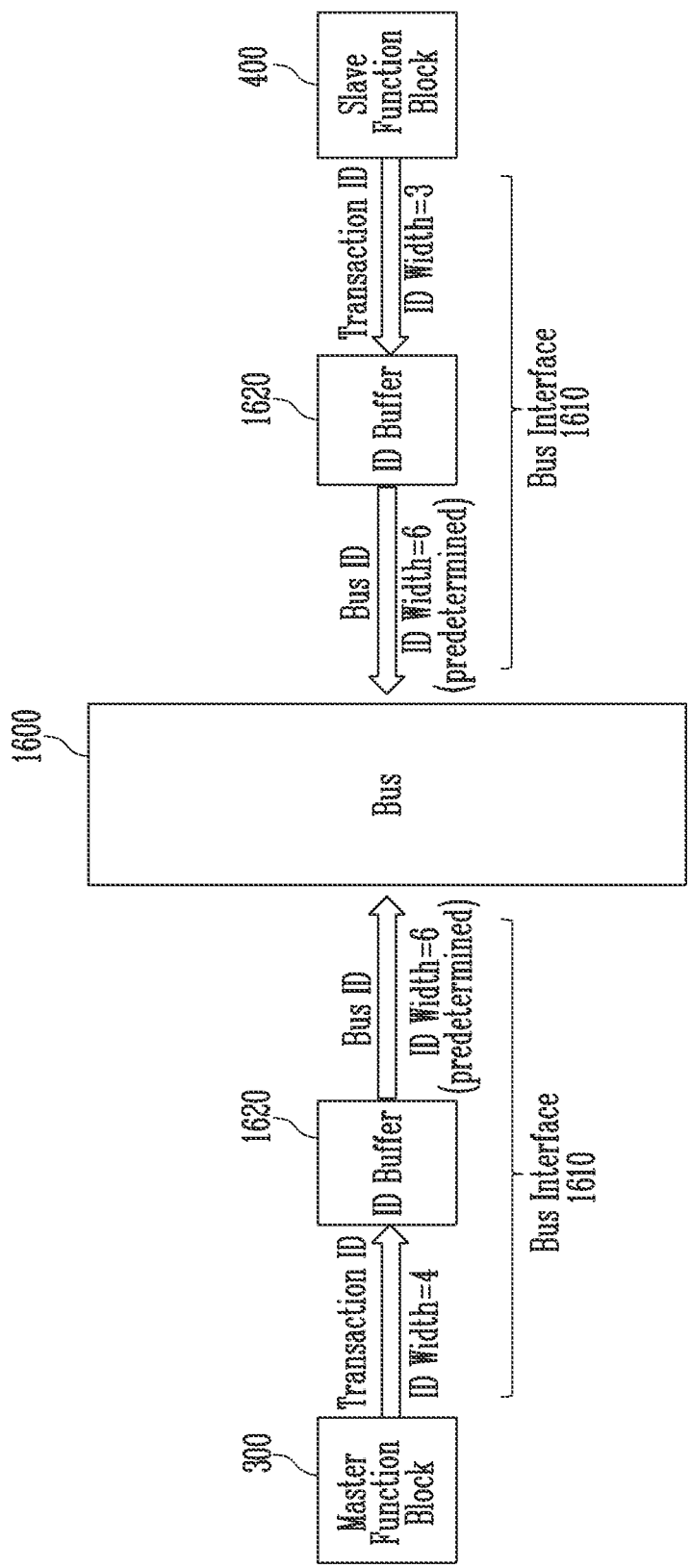
FIG. 15 illustrates an embodiment of a communication process using a bus of a storage device.

FIG. 15 is a diagram illustrating a communication process using a bus of a storage device according to an embodiment of the present disclosure.

Referring to FIG. 15, the master function block 300 may output the transaction ID of the master function block 300 to transmit a request to the slave function block 400. For example, the bit width of the transaction ID of the master function block 300 may be 4. The transaction ID output from the master function block 300 may be temporarily stored in the ID buffer 1620 on the bus interface 1610 connected to the master function block 300.

The transaction ID of the master function block 300 stored in the ID buffer may be converted to have a predetermined bit width and output as the bus ID. For example, the predetermined bit width of the bus ID may be 6. The bus ID may be provided to the slave function block 400 through the bus 1600.

The slave function block 400 may output the transaction ID of the slave function block 400 in order to transmit a response to the request of the master function block 300. For example, the bit width of the transaction ID of the slave function block 400 may be 3. The transaction ID output from the slave function block 400 may be temporarily stored in the ID buffer 1620 on the bus interface 1610 connected to the slave function block 400.

The transaction ID of the slave function block 400 stored in the ID buffer may be converted to have a predetermined bit width and output as the bus ID. For example, the predetermined bit width of the bus ID may be 6. This bus ID may be provided to the master function block 300 through the bus 1600.

In general, the bit width of the bus ID used in communication through the bus 1600 may vary according to the number of master function blocks 300, the bit width of the transaction ID of the master function block 300, and the bit width of the transaction ID of the slave function block 400. As the storage device 50 according to an embodiment of the present disclosure includes an ID buffer set so that all bit widths of the bus ID output regardless of the bit width of the input transaction ID are the same on the bus interface 1610 in which each of function blocks is connected to the bus 1600. Therefore the storage device 50 may perform commmunication using the bus ID having the same bit width even though the number of master function blocks 300 and slave function blocks 400 or the bit width of the transaction ID varies.

Figure 16:
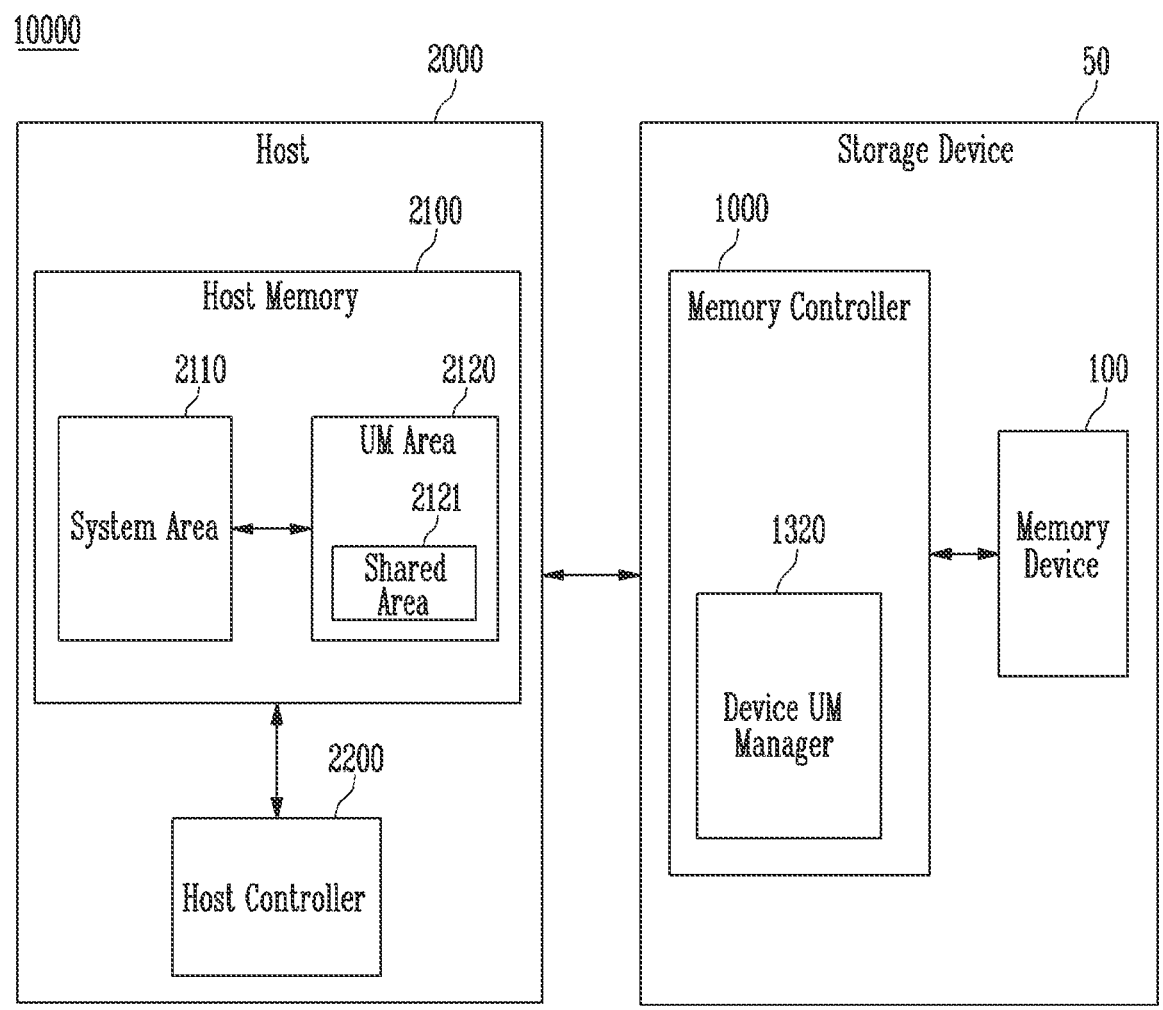
FIG. 16 illustrates an embodiment of an electronic device.

FIG. 16 is a diagram illustrating an electronic device 10000 according to an embodiment of the present disclosure. Referring to FIG. 16, the electronic device 10000 according to an embodiment of the present disclosure may include the storage device 50 and the host 2000.

The storage device 50 may include the memory device 100 and the memory controller 1000. The memory device 100 may store data and may operate in response to control of the memory controller 1000. The memory device 100 may include the memory cell array including the plurality of memory cells storing data. The memory cell array may include the plurality of memory blocks. Each memory block may include the plurality of memory cells. One memory block may include the plurality of pages. In an embodiment, the page may be a unit for storing data in the memory device 100 or reading data stored in the memory device 100. The memory block may be a unit for erasing data.

The memory controller 1000 may include a device unified memory (UM) manager 1320. The device UM manager 1320 may access a UM area 2120 in a host memory 2100 of the host 2000. The device UM manager 1320 may provide information on a specific position that has been accessed or is scheduled to be accessed in the UM area 2120 to the host 2000, or may receive information on a specific position in the UM area 2120 from the host 2000 and then access the specific position based on the information. Position information in the UM area 2120 may be information on an address in the UM area 2120.

The host 2000 may include a host memory 2100 and a host controller 2200. The host memory 2100 may include a system area 2110 accessible only by the host controller 2200 and the UM area 2120 accessible by the storage device 50. The UM area 2120 may include a shared area 2121 which may be an area accessible by both the host controller 2200 and the storage device 50. The UM area 2120 other than the shared area 2121 may be accessed by the storage device 50 and may not be accessed by the host controller 2200. The UM area 2120 may be used as one kind of buffer memory. For example, transmitted data may be temporarily stored in the UM area 2120 during the write operation or the read operation on the storage device.

The host controller 2200 may control the host memory 2100. The host controller 2200 may directly access the system area 2110 and the shared area 2121 of the host memory 2100. The host controller 2200 may not directly access the UM area 2120 other than the shared area 2121, and may perform only data copy between the UM areas 2120 other than the system area 2110 and the shared area 2121 according to a request of the storage device 50. The host controller 2200 may check whether an empty area for storing data exists in the shared area 2121. When the host controller 2200 determines that the empty area for storing data exists in the shared area 2121, the storage device 50 may preferentially use the shared area 2121 as a buffer memory. When the host controller 2200 determines that the empty area for storing data does not exist in the shared area 2121, the storage device 50 may use the UM area 2120 other than the shared area 2121 as the buffer memory. The host controller 2200 may request the storage device 50 to access a specific position by providing information on the specific position in the shared area 2121 to the storage device 50. In one embodiment, the host controller 2200 may receive the information on the specific position of the UM area 2120 other than the shared area 2121 from the storage device 50 and perform data copy between the specific position and the system area 2110.

Figure 17:
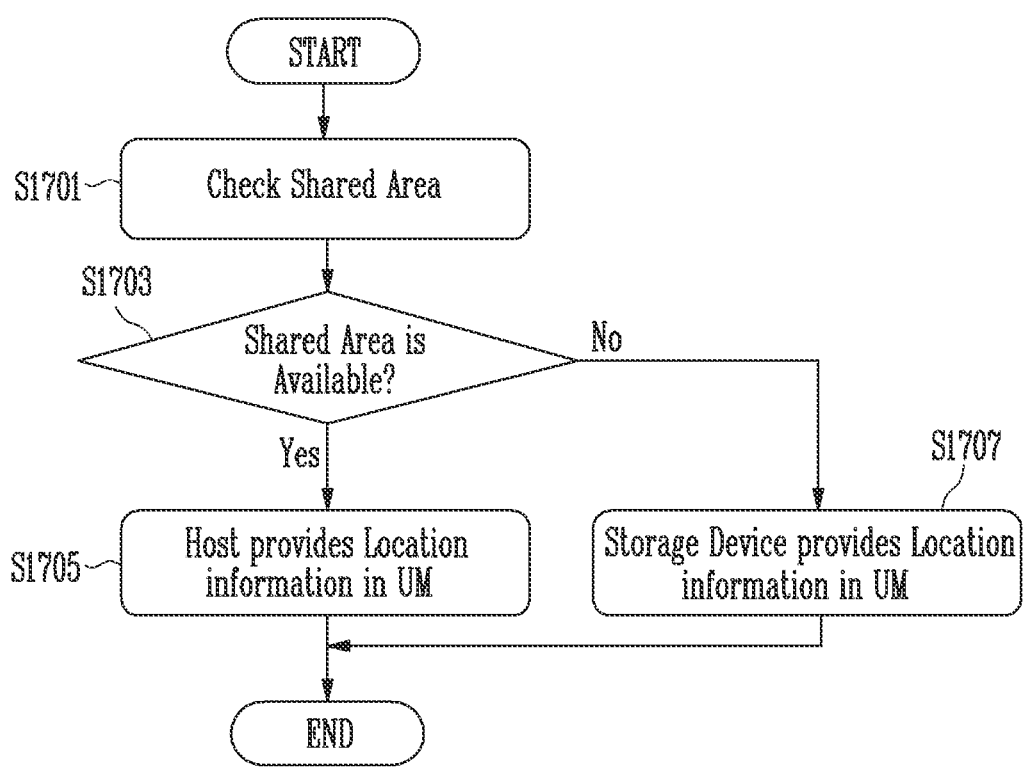
FIG. 17 illustrates operation of an electronic device according to an embodiment of the present disclosure.

FIG. 17 is a flowchart illustrating an operation of an electronic device according to an embodiment of the present disclosure.

Referring to FIGS. 16 and 17, in operation S1701, the host controller 2200 may check whether the empty area for storing data exists in the shared area 2121. When the shared area 2121 may be used because the empty area exists in the shared area 2121 in operation S1703, the host 2000 may provide the position in the UM area 2120 to the storage device 50 (operation S1705). For example, the host 2000 may provide the position information in the shared area 2121 to the storage device 50. On the other hand, the shared area 2121 may not be used because the empty area does not exist in the shared area 2121 in operation S1703, the storage device 50 may provide the position information in the UM area 2120 to the host 2000 (operation S1707). For example, the storage device 50 may provide the position information in the UM area 2120 other than the shared area 2121 to the host 2000.

Figure 18:
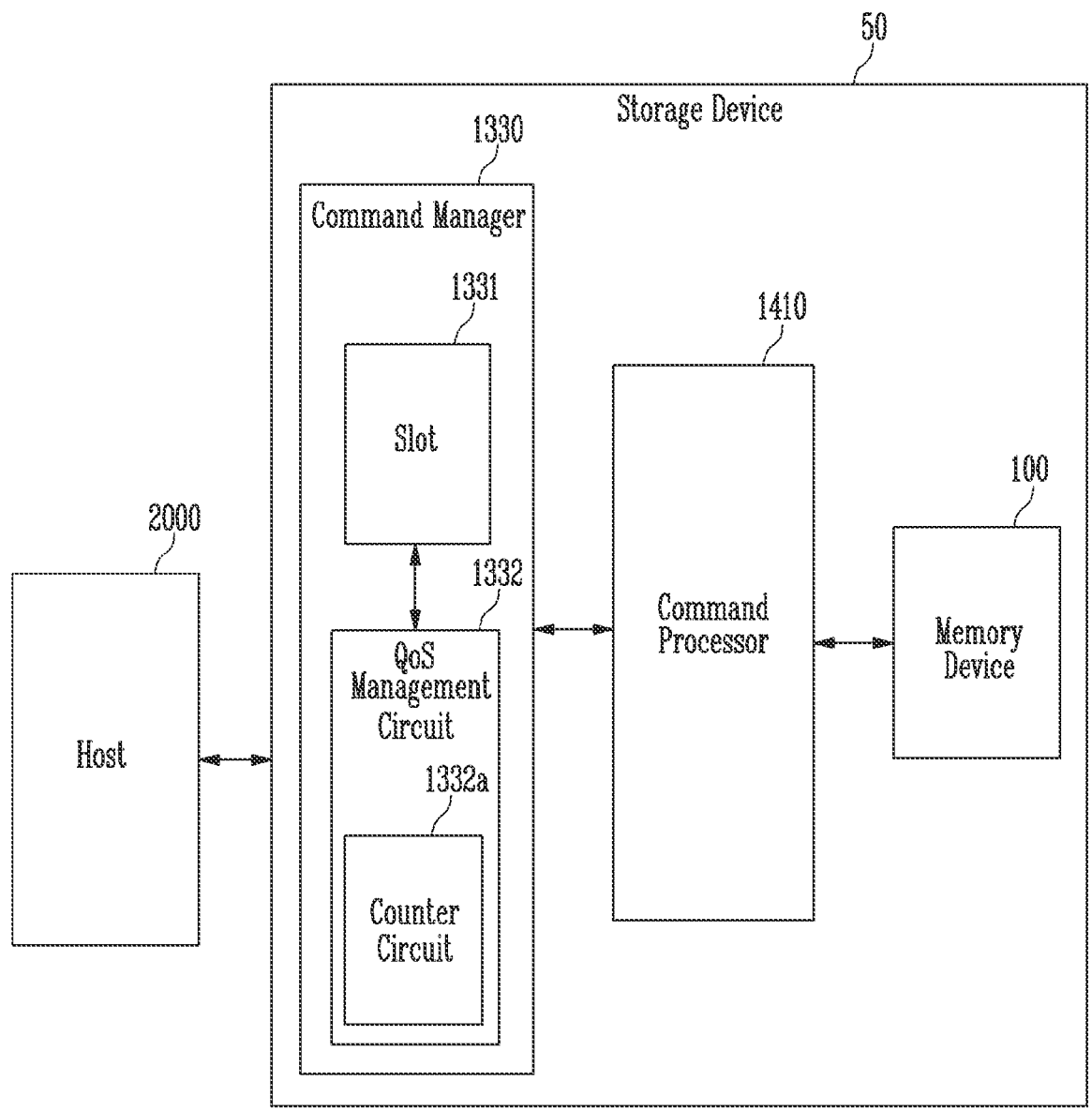
FIG. 18 illustrates an embodiment of a storage device.

FIG. 18 is a diagram illustrating a storage device 50 according to an embodiment of the present disclosure.

Referring to FIG. 18, the storage device 50 may include the memory device 100, a command processor 1410, and a command manager 1330. The command manager 1330 may include a slot 1331 and a quality of service (QoS) management circuit 1332. In an embodiment, a plurality of slots 1331 may be included in the command manager 1330. The plurality of slots may receive a command input from the host 2000.

The QoS management circuit 1332 may include a counter circuit 1332*a*. In an embodiment, the QoS management circuit 1332 may include a plurality of counter circuits 1332*a* respectively corresponding to the plurality of slots 1331. When a command is input to any one of the plurality of slots 1331, a corresponding counter circuit 1332*a* may be activated. The activated counter circuit 1332*a* may be deactivated when the storage device 50 provides a response corresponding to the command to the host 2000. When the storage device 50 fails to provide the response corresponding to the command to the host 2000 until a time exceeds a preset time, the QoS management circuit 1332 may provide an interrupt signal to the command processor 1410. The interrupt signal may, for example, be a signal requesting the command processor 1410 to process the command.

In an embodiment, when the storage device 50 fails to provide the response corresponding to the command to the host 2000 until a time exceeds the preset time, information indicating a state of the command may be stored in a bitmap corresponding to the slot to which the command is input. For example, information indicating that the corresponding command has not been processed for a long time may be stored in the bitmap. When such information is stored in the bitmap, the QoS management circuit 1332 may output the interrupt signal to the command processor 1410 based on the information stored in the bitmap.

The command processor 1410 may receive the command from the plurality of slots 1331 according to a predetermined priority. When processing of the command is completed, the command manager 1330 may be requested to generate a response thereto. When receiving the interrupt signal from the QoS management circuit 1332, the command processor 1410 may recognize that the command corresponding thereto is not being processed. Accordingly, the command processor 1410 may recognize and manage the command that has not been processed for a long time.

The memory device 100 may be controlled according to a command processing result of the command processor 1410. For example, data may be stored in the memory device 100 or data may be read from the memory device according to the command processing result of the command processor 1410.

Figure 19:
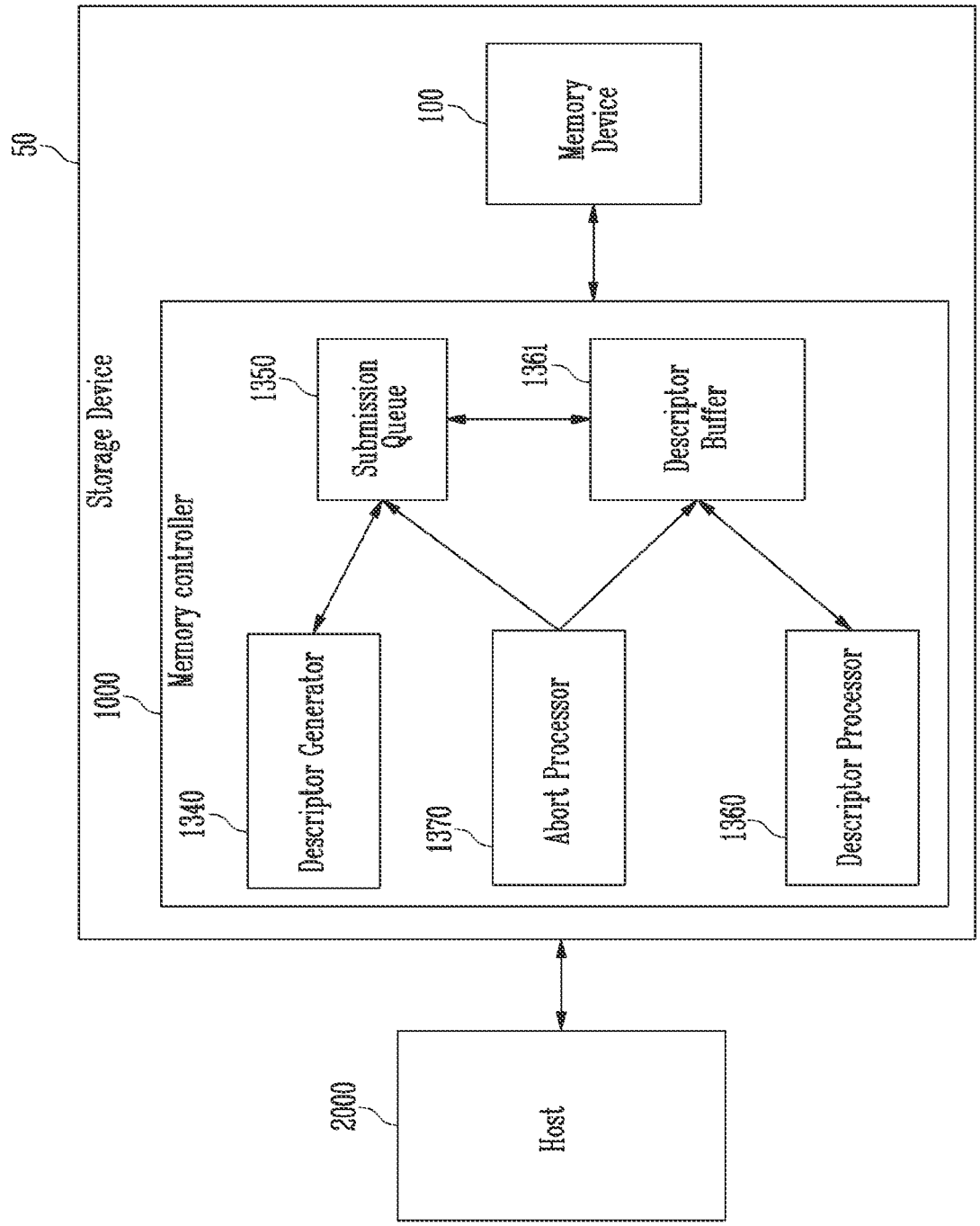
FIG. 19 illustrates an embodiment of a storage device.

FIG. 19 is a diagram illustrating a storage device 50 according to an embodiment of the present disclosure.

Referring to FIG. 19, the storage device 50 according to an embodiment of the present disclosure may include the memory device 100 and the memory controller 1000. The memory device 100 may be controlled by the memory controller 1000.

The memory controller 1000 may include a descriptor generator 1340, a submission queue 1350, a descriptor buffer 1361, a descriptor processor 1360, and an abort processor 1370. The descriptor generator 1340 may generate a descriptor based on a command received from an external source. For example, the descriptor generator 1340 may generate the descriptor based on the command received from the host 2000 outside the memory controller 1000 or the memory device 100. The descriptor generator 1340 may store the generated descriptor in the submission queue 1350.

The submission queue 1350 may be, for example, one kind of system memory area in the memory controller.

The descriptor buffer 1361 may prefetch the descriptor stored in the submission queue 1350. The descriptor processor 1360 may fetch the descriptor stored in the descriptor buffer 1361 according to prefetch and process the fetched descriptor. In FIG. 19, the descriptor buffer 1361 is outside the descriptor processor 1360, but is not limited thereto. For example, in one embodiment the descriptor buffer 1361 may be included in the descriptor processor 1360. The descriptor processor 1360 may output a data packet based on the fetched descriptor. In an embodiment, the data packet may be a protocol information unit (PIU).

The abort processor 1370 may receive information on an abort target command from an external source. Based on the received information, the abort processor 1370 may search for a descriptor corresponding to the abort target command among the descriptors stored in the submission queue 1350 or the descriptor buffer 1361. When the descriptor is prefetched into the descriptor buffer 1361, the descriptor corresponding to the abort target command may be found in the descriptor buffer 1361. Before the descriptor is prefetched into the descriptor buffer 1361, the descriptor corresponding to the abort target command may be found in the submission queue 1350. The abort processor 1370 may store information indicating that the command corresponding to the descriptor corresponding to the abort target command is aborted. Such information may be stored in a preset field in the descriptor.

As described above, the descriptor in which the information indicating that the corresponding command is aborted may be dropped without being processed by the descriptor processor 1360. Therefore, the descriptor processor 1360 may not generate or may not output a data packet corresponding to the descriptor in which information indicating that the command is aborted is stored.

For example, when receiving information on the abort target command, the memory controller 1000 of the storage device 50 according to an embodiment of the present disclosure does not rearrange (reorder) by finding the abort target command itself, stores only information on abort by finding the descriptor corresponding to the abort target command, and does not process the descriptor in which the information on the abort is stored.

Figure 20:
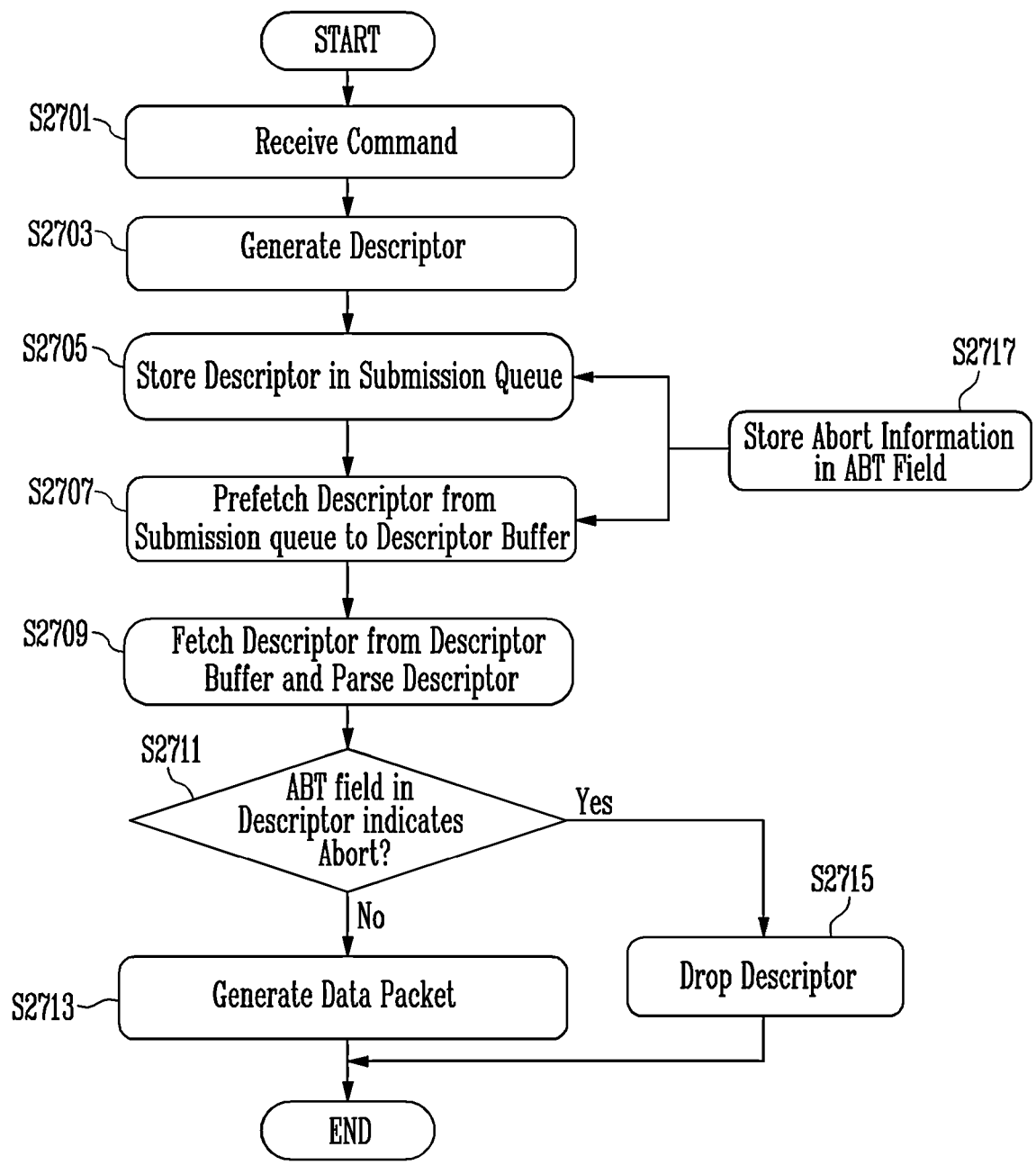
FIG. 20 illustrates an embodiment of a command processing process of a memory controller.

FIG. 20 is a flowchart illustrating a command processing process of a memory controller according to an embodiment of the present disclosure.

Referring to FIGS. 19 and 20, in operation S2701, the memory controller 1000 may receive a command from an external source. For example, the command may be received from the external host 2000 or the memory device 100. In operation S2703, the descriptor generator 1340 of the memory controller 1000 may generate the descriptor based on the received command, and in operation S2705, the descriptor generator 1340 may store the generated descriptor in the submission queue 1350.

In operation S2707, the descriptor buffer 1361 of the memory controller 1000 may prefetch the descriptor from the submission queue 1350. In operation S2709, the descriptor processor 1360 may fetch the descriptor from the descriptor buffer 1361 and process the descriptor by parsing the fetched descriptor.

In operation S2711, the descriptor processor 1360 may check whether an abort field ABT of the descriptor indicates abort. When the abort field ABT of the descriptor does not indicate abort, the descriptor processor 1360 may generate and output the data packet in operation S2713. When the abort field ABT of the descriptor indicates abort, the descriptor processor 1360 may drop the data packet without generating the data packet in operation S2715.

When the abort processor 1370 of the memory controller 1000 receives the information on the abort target command in a process of generating and processing the descriptor, the abort processor 1370 may store abort information in the abort field ABT of the descriptor corresponding to the abort target command in operation S2717. The descriptor corresponding to the abort target command may be searched from among the descriptors queued in the submission queue 1350 according to operation S2705 or prefetched into the descriptor buffer 1361 according to operation S2707.

Figure 21:
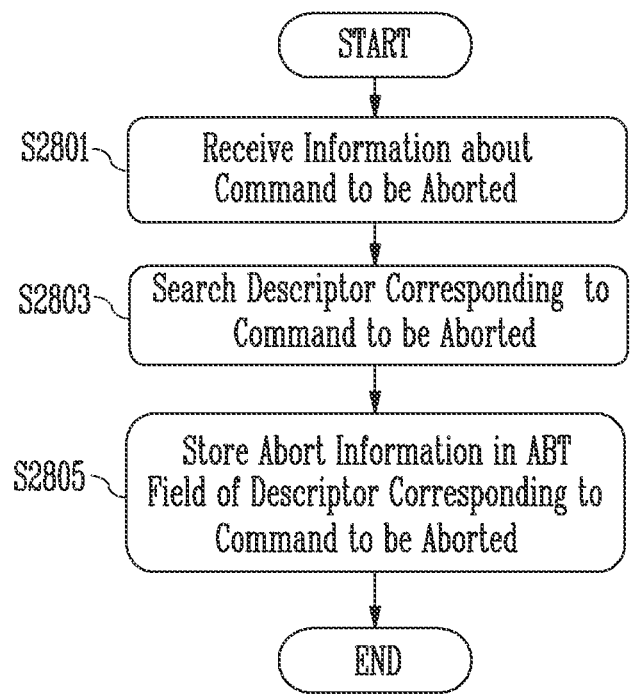
FIG. 21 illustrates an embodiment of a process in which an abort processor of a memory controller processes an abort target command.

FIG. 21 is a diagram illustrating a process in which an abort processor of a memory controller processes an abort target command according to an embodiment of the present disclosure.

Referring to FIGS. 19 to 21, the process in which the abort processor 1370 processes the abort target command in FIG. 21 relative to operation S2717 is described in FIG. 20.

First, in operation S2801, the abort processor 1370 may receive the information on the abort target command. Accordingly, in operation S2803, the abort processor 1370 may search for the descriptor corresponding to the abort target command. The abort target command may be searched from among the descriptors queued in the submission queue 1350 or prefetched into the descriptor buffer 1361.

In operation S2805, the abort processor 1370 may store information that the command corresponding to the abort field ABT of the descriptor corresponding to the searched abort target command is an abort target. Accordingly, at a later time, the descriptor processor 1360 may determine whether to process by checking the abort field ABT of the descriptor.

Figure 22:
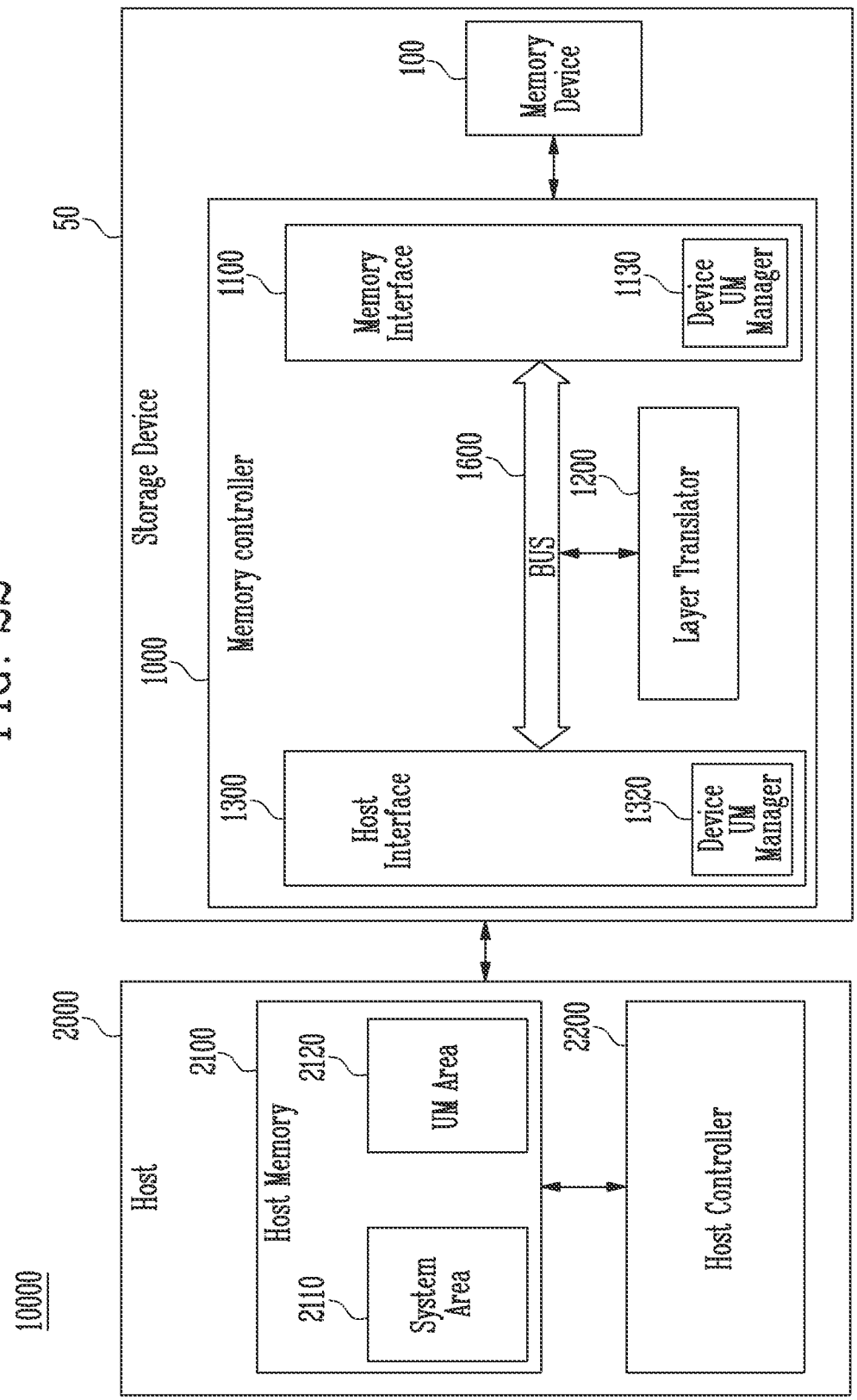
FIG. 22 illustrates an embodiment of an electronic device.

FIG. 22 is a diagram illustrating the electronic device 10000 according to an embodiment of the present disclosure.

Referring to FIG. 22, the electronic device 10000 according to an embodiment of the present disclosure may include the storage device 50 and the host 2000. The storage device 50 may include the memory device 100 and the memory controller 1000.

The memory device 100 may store data and may operate in response to control of the memory controller 1000. The memory device 100 may include the memory cell array that includes the plurality of memory cells storing data. The memory cell array may include the plurality of memory blocks. Each memory block may include the plurality of memory cells. One memory block may include the plurality of pages. In an embodiment, the page may, for example, be a unit for storing data in the memory device 100 or reading data stored in the memory device 100. The memory block may be a unit for erasing data.

The memory controller 1000 may include the host interface 1300, the memory interface 1100, and the layer converter 1200. The memory controller 1000 may control overall operation of the storage device 50. When power is applied to the storage device 50, the memory controller 1000 may execute firmware (FW). When the memory device 100 is a flash memory device, the memory controller 1000 may execute firmware such as the FTL for controlling communication between the host 2000 and the memory device 100.

The host interface 1300 may be configured of firmware corresponding to the HIL that manages an interface with the host 2000 and hardware for implementing the firmware. The host interface 1300 may communicate with the host 2000.

The host interface 1300 may provide the requests received from the host 2000 to the layer converter 1200. The host interface 1300 may provide a result of performing the requests received from the host 2000 to the host 2000.

The host interface 1300 may include the device UM manager 1320. The device UM manager 1320 may access the UM area 2120 in the host memory 2100 of the host 2000.

The memory interface 1100 may be configured of firmware corresponding to the MIL that manages the interface with the memory device 100 and hardware for implementing the firmware. The memory interface 1100 may communicate with the memory device 100 and may provide the commands corresponding to the requests received from the layer converter 1200 to the memory device 100. The memory interface 1100 may receive a result of commands performed by the memory device.

The memory interface 1100 may also include a device UM manager 1130. The device UM manager 1130 of the memory interface 1100 may directly access the UM area 2120 in the host memory 2100 of the host 2000 without passing through the host interface 1300 as necessary.

The layer converter 1200 may be configured of firmware corresponding to the conversion layer that manages the conversion between the host interface layer and the memory interface layer, such as an FTL, and hardware for implementing the firmware. The layer converter 1200 may convert the logical address included in the request from the host 2000 into the physical address. In an embodiment, the physical address may be the address indicating the specific memory area included in the flash memory device.

In addition, the memory controller 1000 may include the bus 1600 which may be configured to provide the channel between components of the memory controller 1000.

The host 2000 may include the host memory 2100 and the host controller 2200. The host memory 2100 may include the system area 2110 accessible only by the host controller 2200 and the UM area 2120 accessible by the storage device 50. The UM area 2120 may be used as one kind of buffer memory. For example, the transmitted data may be temporarily stored in the UM area 2120 during the write operation or the read operation on the storage device.

The host controller 2200 may control the host memory 2100. In addition, the host controller 2200 may communicate with the storage device 50.

The host interface 1300 may receive a write command and data corresponding to the write command from the host 2000. The memory interface 1100 may store the received data in the memory device 100 in response to the received write command. When data storage fails in a process of storing the data in the memory device 100, the host interface 1300 may receive the data from the host 2000 again. At this time, the data may be stored in the UM area 2120 in the host 2000. The host interface 1300 may provide a response to the write command to the host 2000 after the data corresponding to the write command is stored in the memory device 100.

In an embodiment, the host interface 1300 may provide a command requesting the host 2000 to provide the data again. In response, the host 2000 may provide the data again to the host interface 1300. At this time, the command requesting to provide the data again may include information on a position in the host memory 2100 of the host 2000, and more particularly, information on a position in the UM area 2120.

For example, in an embodiment, when the host interface 1300 receives the write command from the host 2000, the host interface 1300 may request to copy data loaded into the system area 2110 in the host memory 2100 of the host 2000 to the UM area 2120. At this time, a copy request provided by the host interface 1300 may include information on a specific position in the UM area 2120 where data is to be copied and stored from the system area 2110. In another embodiment, when the host interface 1300 receives the write command and the data corresponding thereto from the host 2000, the host interface 1300 may back up the received data in the UM area 2120 in the host memory 2100 of the host 2000. Accordingly, data to be stored in the memory device 100 is stored in the UM area 2120 in the host memory 2100 of the host 2000, and even though data storage in the memory device 100 fails, the host interface 1300 may receive the data again from the UM area 2120 in the host memory 2100. In addition, since the host interface 1300 has the information on the position in which the data is stored in the UM area 2120, the command requesting to provide the data provided by the host interface 1300 again may include information on a position in the host memory 2100 of the host 2000, more specifically, information on a position in the UM area 2120.

In another embodiment, the host interface 1300 may receive address information in the host memory 2100 from the host 2000. For example, the address information in the host memory 2100 may be information on a physical region descriptor table (PRDT) or information on a physical address in the host memory 2100. At this time, the address information in the host memory 2100 may be provided by the host 2000 to the host interface 1300 through a command, or may be read by the host interface 1300 from the host 2000 directly. The host interface 1300 may directly obtain data in the host memory 2100 based on the address information in the host memory 2100 received from the host 2000. Therefore, when the data storage fails in a process of storing the data in the memory device 100, the host interface 1300 may directly obtain the data from the UM area 2120 in the host memory 2120 of the host 2000 again.

The host interface 1300 may receive a read command from the host 2000. The memory interface 1100 may read the data from the memory device 100 in response to the received read command, and may provide the read data to the host memory 2100 in the host 2000. That is, the memory interface 1100 may directly provide the data to the UM area 2120 in the host memory 2100 without passing through the host interface 1300 by the device UM manager 1130 included in the memory interface 1100. When data storage fails in a process of storing the data in the host memory 2100, the memory interface 1100 may provide the data to the host memory 2100 again. At this time, the data may be provided to the UM area 2120 in the host memory 2100. The host interface 1300 may provide a response to the read command to the host 2000 after the read data is stored in the host memory 2100.

In an embodiment, the memory interface 1100 may provide identification information corresponding to the read data together with the read data to the host memory 2100 in the host 2000. In an embodiment, the memory interface 1100 may provide a data packet including the read data to the host memory 2100. A specific field of the data packet may indicate the identification information corresponding to the read data. For example, when the read data is provided to the host memory 2100 in a form of DATA IN PIU, the identification information corresponding to the read data may be stored in a data buffer offset field in the DATA IN PIU. When data storage fails in a process of storing the data in the host memory 2100, the memory interface 1100 may provide the data to the host memory 2100 again together with the read data and the identification information corresponding thereto.

In another embodiment, the host interface 1300 may receive the address information in the host memory 2100 from the host 2000. For example, the address information in the host memory 2100 may be the information on the PRDT or the information on the physical address in the host memory 2100. At this time, the address information in the host memory 2100 may be provided by the host 2000 to the host interface 1300 through the command, or may be read by the host interface 1300 from the host 2000 directly. The memory interface 1100 may directly store the data in the host memory 2100 based on the address information in the host memory 2100 received by the host interface 1300 from the host 2000. Therefore, when data storage fails in a process of storing the data in the host memory 2100, the memory interface 1100 may directly store data in the UM area 2120 in the host memory 2100 of the host 2000 again.

Figure 23:
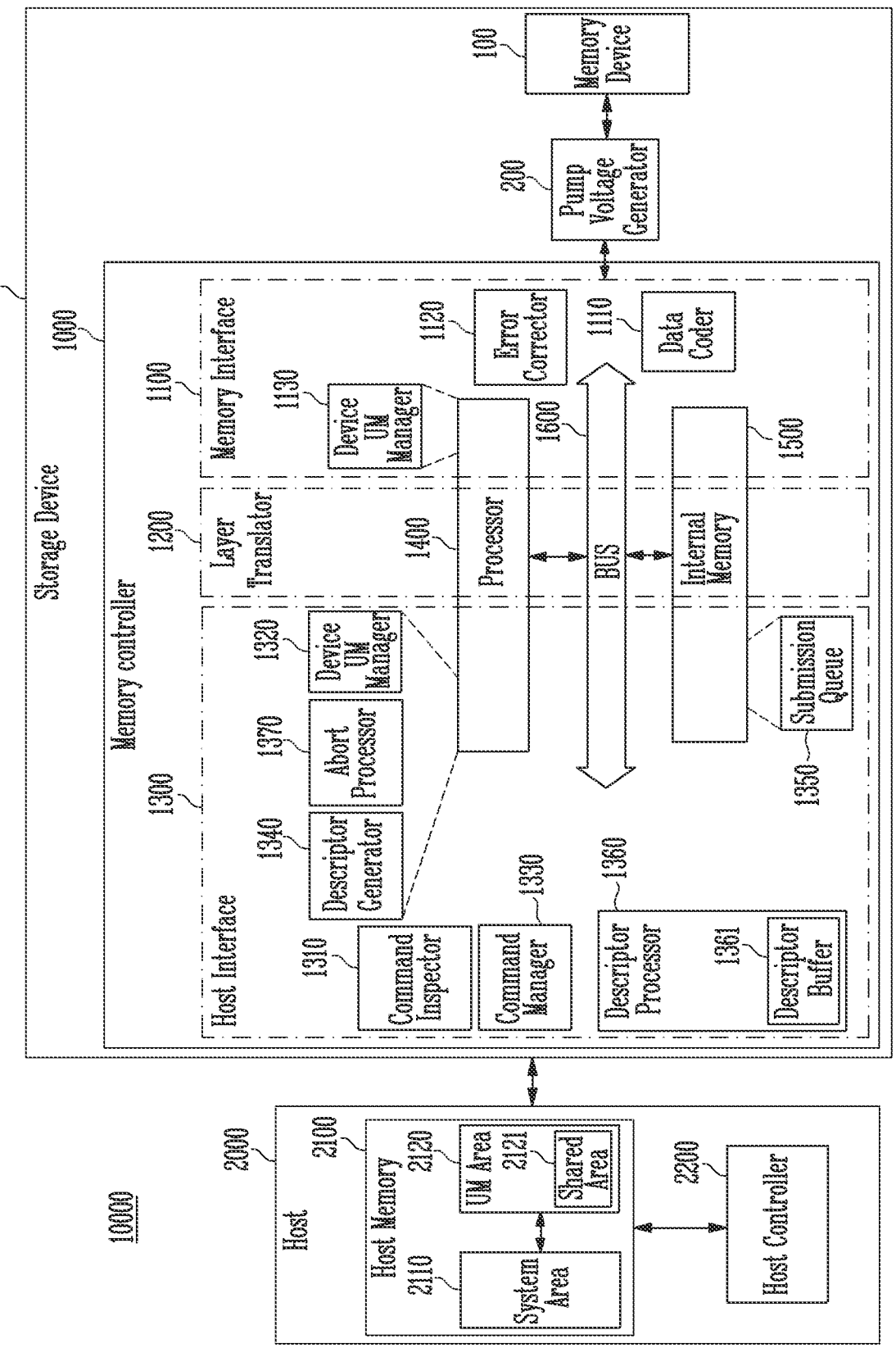
FIG. 23 illustrates an embodiment of an electronic device.

FIG. 23 is a diagram illustrating the electronic device 10000 according to an embodiment of the present disclosure.

Referring to FIGS. 1, 2, 7, 13, 16, 18, 19, 22, and 23, the electronic device 10000 may include the host 2000 and the storage device 50.

The host memory 2100 may include the system area 2110 accessible only by the host controller 2200 and the UM area 2120 accessible by the storage device 50. The UM area 2120 may include the shared area 2121. The shared area 2121 may be an area accessible by both of the host controller 2200 and the storage device 50. The UM area 2120 other than the shared area 2121 may be accessed only by the storage device 50 and may not be accessed by the host controller 2200. The UM area 2120 may be used as one kind of buffer memory. For example, transmitted data may be temporarily stored in the UM area 2120 during the write operation or the read operation on the storage device.

The host controller 2200 may control the host memory 2100 and may communicate with the storage device 50. The host controller 2200 may control the host memory 2100 and may directly access the system area 2110 and the shared area 2121 of the host memory 2100. The host controller 2200 may not directly access the UM area 2120 other than the shared area 2121, and may perform only data copy between the UM areas 2120 other than the system area 2110 and the shared area 2121 according to the request of the storage device 50.

The host controller 2200 may check whether the empty area for storing data exists in the shared area 2121. When the host controller 2200 determines that the empty area for storing data exists in the shared area 2121, the storage device 50 may preferentially use the shared area 2121 as the buffer memory. When the host controller 2200 determines that the empty area for storing data does not exist in the shared area 2121, the storage device 50 may use the UM area 2120 other than the shared area 2121 as the buffer memory. The host controller 2200 may request the storage device 50 to access the specific position by providing the information on the specific position in the shared area 2121 to the storage device 50. Alternatively, the host controller 2200 may receive the information on the specific position of the UM area 2120 other than the shared area 2121 from the storage device 50 and perform data copy between the specific position and the system area 2110.

The storage device 50 may include the memory controller 1000, the pump voltage generator 200, and the memory device 100. The memory controller 1000 may include the host interface 1300, the memory interface 1100, and the layer converter 1200. The memory controller 1000 may control overall operation of the storage device 50. When power is applied to the storage device 50, the memory controller 1000 may execute firmware (FW). When the memory device 100 is a flash memory device, the memory controller 1000 may execute firmware such as the FTL for controlling communication between the host 2000 and the memory device 100. The firmware may be stored or loaded in a partial area of an internal memory 1500 and may be executed by a processor 1400.

The host interface 1300 may be configured of firmware corresponding to the HIL that manages the interface with the host 2000 and hardware for implementing the firmware. The host interface 1300 may communicate with the host 2000.

The memory interface 1100 may be configured of firmware corresponding to the MIL that manages the interface with the memory device 100 and hardware for implementing the firmware. The memory interface 1100 may communicate with the memory device 100 and may provide commands corresponding to the requests received from the layer converter 1200 to the memory device 100. The memory interface 1100 may receive a result of the commands performed by the memory device.

The layer converter 1200 may be configured of firmware corresponding to the conversion layer that manages the conversion between the host interface layer and the memory interface layer, such as an FTL, and hardware for implementing the firmware. The layer converter 1200 may convert the logical address included in the request from the host 2000 into the physical address. In an embodiment, the physical address may be the address indicating the specific memory area included in the flash memory device.

In addition, the memory controller 1000 may include the bus 1600 which may be configured to provide the channel between components of the memory controller 1000.

The host interface 1300 may receive the command from the host 2000, and the command inspector 1310 of the host interface 1300 may check whether the command is a command requesting access to the access restricted area 111. The command inspector 1310 may inspect the command based on the information on the access restricted area stored in the internal access restricted area information storage 1311. When the command from the host 2000 is the command for requesting access to the access restricted area, the command inspector 1310 may generate information indicating that the corresponding command is the command for requesting access to the access restricted area, and provide the information to the submission queue 1350. The submission queue 1350 may be a partial area in the internal memory 1500 of the memory controller 1000. The command in which the information indicating that the command from the host 2000 is the command requesting access to the access restricted area is generated may not be processed by the processor 1400 and may be dropped.

In addition, when the host interface 1300 receives the command from the host 2000, the command may be input to any one of the plurality of slots 1331 in the command manager 1330 of the host interface 1300. When the command is input to any one of the slots 1331, the counter circuit 1332a corresponding to the slot 1331 to which the command is input in the QoS management circuit 1332 may be activated. The activated counter circuit 1331 may be deactivated when the storage device 50 provides a response corresponding to the command to the host 2000. When the activated counter circuit 1331 does not provide the response corresponding to the command to the host 2000 until a time exceeds a preset time, the QoS management circuit 1332 may provide the interrupt signal requesting processing of the command to the command processor 1410.

In addition, when the host interface 1300 receives the command from the host 2000, the descriptor generator 1340 in the host interface 1300 may generate the descriptor based on the received command. The generated descriptor may be stored in the submission queue 1350, and the descriptor buffer 1361 may prefetch the descriptor. At this time, when the abort processor 1370 of the host interface receives the information on the abort target command, the abort processor 1370 may search for the descriptor stored in the submission queue 1350 or the descriptor buffer 1361 to find the descriptor corresponding to the abort target command. The abort processor 1370 may store information indicating that the command corresponding to the descriptor corresponding to the abort target command is aborted. The descriptor processor 1360 may fetch, parse, and process the descriptor from the descriptor buffer 1361. At this time, the descriptor in which the information indicating that the corresponding command is aborted may not be processed. The descriptor processor 1360 may generate a data packet with respect to the processed descriptor and provide the data packet to the host 2000.

The memory interface 1100 receiving the data from the host interface 1300 may provide the data to the memory device 100. At this time, the error corrector 1120 in the memory interface 1100 may perform error correction encoding on the data provided to the memory device 100 in the error correction performance unit, and may generate a codeword to which a parity bit is added. In addition, the error corrector 1120 may perform error correction decoding on the data read from the memory device 100 and may determine whether the error correction decoding is successful according to a result of the error correction decoding. The error corrector 1120 may correct an error bit of the data using the parity bit. When the number of error bits is equal to or greater than the correctable error bit limit, the error corrector 1120 may not correct the error bit, and an error correction failure (fail) may occur.

In addition, the data coder 1110 in the memory interface 1100 may encode the data received from the layer converter 1200 based on the previously stored algorithm or code. The encoded data may be provided to the memory device 100. Alternatively, the data may be determined by decoding the data provided from the memory device 100. The data coder 1110 may include the raw data storage 1111, the counter 1112, the previous data storage 1113, and the data output circuit 1114. The data coder 1110 may output the inverted or non-inverted conversion data by determining whether to invert the currently input raw data Raw Data. For example, whether to invert may be determined based on the number (or information) of bits corresponding to the reference data bit among bits of the currently input raw data. When the data coder 1110 receives data of which the number of bits is 2N as the raw data, the data coder 1110 may invert or not invert and output the data so that the number of bits corresponding to the reference data bit exceeds N among the bits included in the output data (current data). When the number of bits corresponding to the reference data bit among the bits included in the raw data is N, the data coder 1110 may output data in consideration of the previous data output by converting the previous raw data input before the current raw data input. In more detail, the data coder 1110 may output data by determining whether to invert the current raw data so that a bit transition from the previous data to the current data, that is, a toggle, is reduced or minimized.

The memory device 100 may include the memory cell array 110, the voltage generator 120, the address decoder 130, the input/output circuit 140, and the control logic 150.

The memory cell array 110 may include the plurality of memory blocks. The plurality of memory blocks may be connected to the address decoder 130 through the row lines RL. The memory blocks may be connected to the input/output circuit 140 through the column lines CL. In an embodiment, the row lines RL may include the word lines, the source select lines, and the drain select lines. In an embodiment, the column lines CL may include the bit lines. At this time, the address of the bit lines may be rearranged so that bit lines Fail BLy on which the test operation is failed are uniformly included for each error correction performance unit. Information on the address of the bit lines rearranged described above may be included in the memory cell array 110.

The memory cell array 110 may include the access restricted area 111. The access restricted area 111 may be an area in which external access is restricted. Since the command determined by the command inspector 1310 as the command requesting access to the access restricted area 111 is not processed by the memory controller 1000, access to the access restricted area 111 may be restricted.

In an embodiment, the voltage generator 120, the address decoder 130, and the input/output circuit 140 may be collectively referred to as the peripheral circuit. The peripheral circuit may drive the memory cell array 110 under the control of the control logic 150. The peripheral circuit may drive the memory cell array 110 to perform the program operation, the read operation, and the erase operation.

The voltage generator 120 is configured to generate the plurality of operation voltages using the pump voltage supplied from the pump voltage generator 200. The voltage generator 120 operates in response to the control of the control logic 150.

The plurality of generated operation voltages may be supplied to the memory cell array 110 by the address decoder 130.

The address decoder 130 is connected to the memory cell array 110 through the row lines RL. The address decoder 130 is configured to operate in response to control of the control logic 150. The address decoder 130 may receive an address ADDR from the control logic 150. The address decoder 130 may decode a block address among the received addresses ADDR. The address decoder 130 selects at least one memory block among the memory blocks according to the decoded block address. The address decoder 130 may decode a row address among the received addresses ADDR. The address decoder 130 may select at least one word line among word lines of a selected memory block according to the decoded row address. In an embodiment, the address decoder 130 may decode a column address among the received addresses ADDR. The address decoder 130 may connect the input/output circuit 140 and the memory cell array 110 to each other according to the decoded column address. For example, the address decoder 130 may include components such as a row decoder, a column decoder, and an address buffer.

The input/output circuit 140 may include a plurality of page buffers which may be connected to the memory cell array 110 through the bit lines. During the program operation, data may be stored in selected memory cells according to data stored in the plurality of page buffers. Data input through the input/output circuit 140 may be data coded by the data coder 1110 and the error corrector 1120.

During the read operation, the data stored in the selected memory cells may be sensed through the bit lines, and the sensed data may be stored in the page buffers.

The control logic 150 may control the address decoder 130, the voltage generator 120, and the input/output circuit 140. The control logic 150 may operate in response to the command CMD transmitted from an external device. The control logic 150 may generate control signals in response to the command CMD and the address ADDR to control the peripheral circuits.

The pump voltage generator 200 may receive the input voltage $V_{CC}$ or the reference (e.g., ground) voltage GND under the control of the memory controller 1000. The pump voltage generator 200 may generate the pump voltage $V_{PP}$ based on such input values and supply the pump voltage $V_{PP}$ to the voltage generator 120. In addition, the pump voltage generator 200 may receive the ready busy signal $RB_n$ from the control logic 150, and may determine whether to generate the pump voltage $V_{pp}$ according to the received ready busy signal.

The UM area 2120 of the host 2000 may be accessible by the device UM manager 1320 of the host interface 1300 or the device UM manager 1130 of the memory interface 1100. In addition, the shared area 2121 in the UM area 2120 may be accessible by the device UM manager 1320 of the host interface 1300 or the device UM manager 1130 of the memory interface 1100 and the host controller 2200. The UM area 2120 may be used as one kind of buffer memory, and the position information in the UM area 2120 may be provided to the storage device 50 by the host controller 2200 or may be provided to the host 2000 by the device UM manager 1320 of the host interface 1300 or the device UM manager 1130 of the memory interface 1100.

When the device UM manager 1320 of the host interface 1300 or the device UM manager 1130 of the memory interface 1100 provides the position information in the UM area 2120, then, in an embodiment, the host controller 2200 may convert the position information provided by the device UM manager 1320 of the host interface 1300 or the device UM manager 1130 of the memory interface 1100 into the address in the UM area 2120 to access the UM area 2120.

In another embodiment, as the memory controller 1000 may receive address information of the UM area 2120 from the host 2000 in advance, the device UM manager 1320 of the host interface 1300 or the device UM manager 1130 of the memory interface 1100 may provide the address in the UM area 2120 to the host controller 2200, and the host controller 2200 may directly access the UM area 2120 without additional address conversion. Here, the address in the UM area 2120 may be provided by being included in the command provided by the host 2000 to the storage device 50, or the memory controller 1000 may obtain the address in the UM area 2120 by directly reading the address in the UM area 2120 from the host 2000.

In the memory controller 1000, the descriptor generator 1340, the abort processor 1370, the device UM managers 1320 and 1130, and the like may be a functional configuration performed by the processor 1400 in the memory controller 1000. The command inspector 1310, the command manager 1330, the descriptor processor 1360, and the like may be separate configurations in the memory controller 1000 that are distinguished from the processor 1400 and the internal memory 1500.

Figure 24:
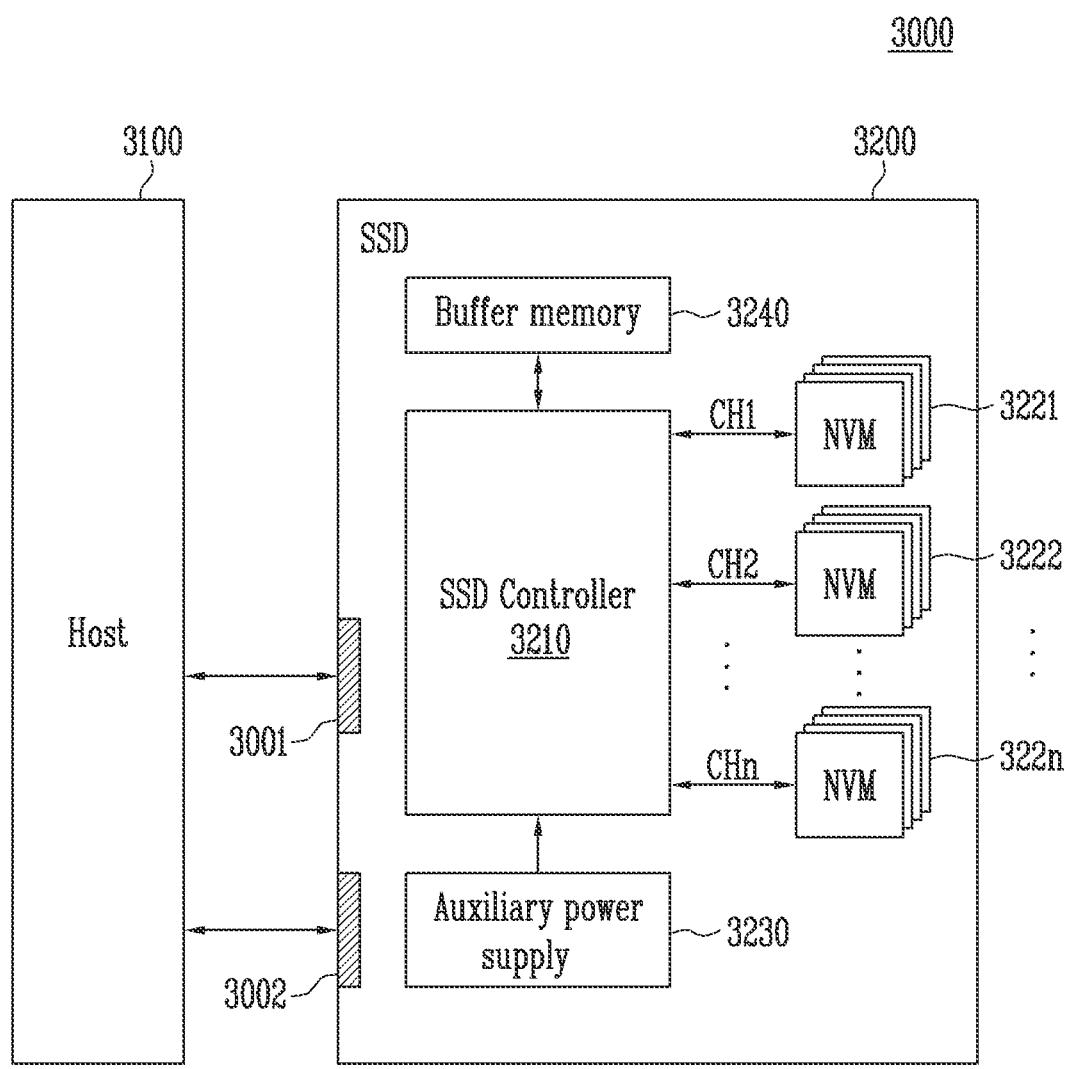
FIG. 24 illustrates an embodiment of a solid state drive (SSD) system including a storage device.

FIG. 24 is a block diagram illustrating a solid state drive (SSD) system 3000 to which a storage device according to an embodiment of the present disclosure is applied.

Referring to FIG. 24, the SSD system 3000 includes a host 3100 and an SSD 3200. The SSD 3200 exchanges signals with the host 3100 through a signal connector 3001 and receives power through a power connector 3002. The SSD 3200 includes an SSD controller 3210, a plurality of flash memories 3221 to 322n, an auxiliary power supply 3230, and a buffer memory 3240.

According to an embodiment of the present disclosure, the SSD controller 3210 may perform the function of the memory controller 1000 described with reference to FIG. 1, 16, 18, 19, 22, or 23.

The SSD controller 3210 may control the plurality of flash memories 3221 to 322n in response to one or more signals received from the host 3100. For example, the one or more signals may be based on an interface between the host 3100 and the SSD 3200.

The auxiliary power supply 3230 is connected to the host 3100 through the power connector 3002. The auxiliary power supply 3230 may receive the power from the host 3100 and may charge the power. The auxiliary power supply 3230 may provide power of the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory (e.g., a DRAM, an SDRAM, a DDR SDRAM, an LPDDR SDRAM, and a GRAM) or a nonvolatile memory such as an FRAM, a ReRAM, an STT-MRAM, or a PRAM.

Figure 25:
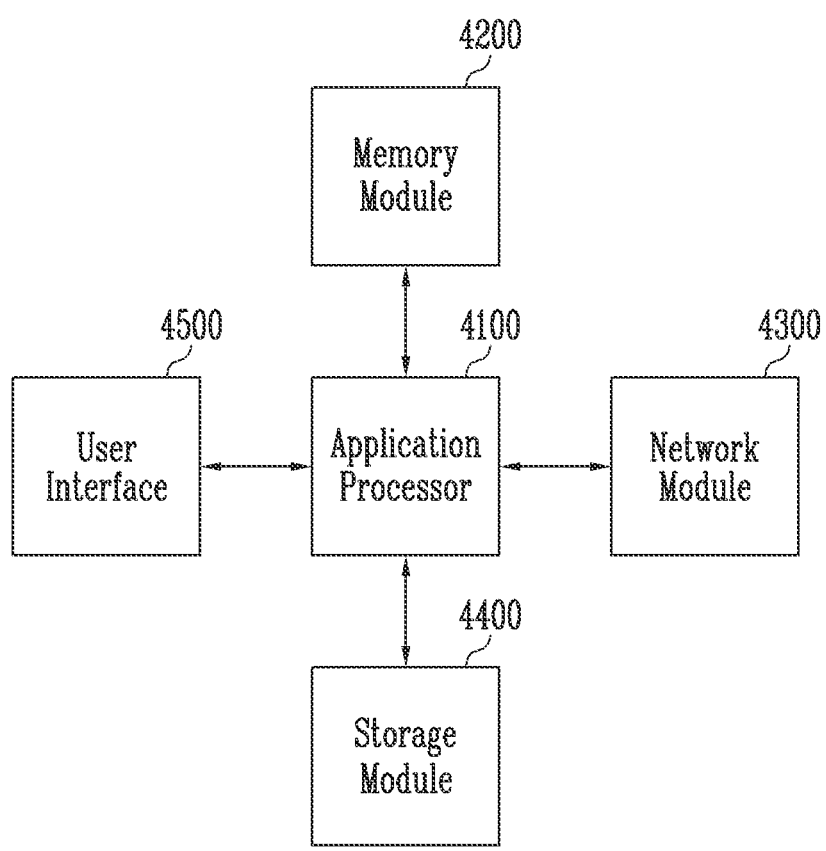
FIG. 25 illustrates an embodiment of a user system including a storage device.

FIG. 25 is a block diagram illustrating a user system 4000 to which the storage device according to an embodiment of the present disclosure is applied.

Referring to FIG. 25, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory (e.g., a DRAM, an SDRAM, a DDR SDRAM, a DDR2 SDRAM, a DDR3 SDRAM, an LPDDR SDARM, an LPDDR2 SDRAM, and an LPDDR3 SDRAM) or a nonvolatile random access memory, such as a PRAM, a ReRAM, an MRAM, and an FRAM. For example, the application processor 4100 and memory module 4200 may be packaged based on a package-on-package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, which, for example, may operate identically to the memory device 100 described with reference to FIG. 1, 16, 18, 19, 22, or 23.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, devices, modules, units, multiplexers, generators, logic, interfaces, coders, counters, blocks, managers, circuits, decoders, drivers, generators and other signal generating and signal processing features of the embodiments disclosed herein may be implemented, for example, in non-transitory logic that may include hardware, software, or both. When implemented at least partially in hardware, the controllers, processors, devices, modules, units, multiplexers, generators, logic, interfaces, coders, counters, blocks, managers, circuits, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, modules, units, multiplexers, generators, logic, interfaces, coders, counters, blocks, managers, circuits, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although various embodiments have been described for illustrative purposes, it will be apparent to those skilled in the art that various changes and modifications may be made without departing from the spirit and scope of the invention as defined in the following claims. The embodiments may be combined to form additional embodiments.

What is claimed is:

1. A storage device comprising:
   a memory device;
   a pump voltage generator configured to externally supply a pump voltage to the memory device; and
   a memory controller configured to provide conversion data obtained by converting data received from an external host to the memory device,
   wherein the memory controller is configured to:
      receive raw data having a total number of bits is 2N,
      invert and output the raw data according to a comparison result with previous data output before the raw data when a number of reference data bits included in the raw data is N, and
      output the conversion data by inverting the raw data according to the number of reference data bits included in the raw data when the number of reference data bits included in the raw data is not N, and
   wherein the pump voltage generator receives a ready busy signal from the memory device.

2. The storage device of claim 1, wherein the memory controller performs an error correction operation on the memory device in a predetermined error correction performance unit.

3. The storage device of claim 2, wherein the memory device includes memory cells respectively connected to a plurality of bit lines.

4. The storage device of claim 3, wherein the memory device includes a fail bit line information storage configured to store information on bit lines on which a test operation is failed among the plurality of bit lines.

5. The storage device of claim 4, wherein the information on the failed bit lines includes information on an address of the plurality of bit lines in which a number difference of the failed bit lines does not exceed '1' for each error correction performance unit.

6. The storage device of claim 5, wherein the memory device comprises:
- a memory cell array including the memory cells, the memory cell array configured to store information on the failed bit line in at least a partial area;
- a peripheral circuit connected to the memory cells through the plurality of bit lines; and
- an address decoder configured to decode an address based on the information on the failed bit line and provide decoded address to the peripheral circuit.

7. The storage device of claim 4, wherein the information on the failed bit lines includes information on an address of the plurality of bit lines including a same number of failed bit lines for each error correction performance unit.

8. The storage device of claim 1, wherein the pump voltage generator outputs the pump voltage based on the ready busy signal.

9. The storage device of claim 1, further comprising:
- a bus on which the data move between the external host and the memory device; and
- a plurality of function blocks connected to the bus through respective bus interfaces.

10. The storage device of claim 9, wherein the plurality of function blocks include a slave function block and a master function block configured to provide a bus ID to the slave function block together with a request when transmitting the request to the slave function block through the bus interface.

11. The storage device of claim 10, wherein the master function block and the slave function block transmit the bus ID together with data corresponding to the request when communicating the data.

12. The storage device of claim 9, wherein the bus interfaces include ID buffers configured to:
- respectively store a transaction ID of the corresponding function blocks, and
- output the transaction ID as a bus ID having a predetermined bit width.

13. The storage device of claim 12, wherein all bus IDs output from the ID buffers have a same bit width.

14. The storage device of claim 13, wherein the memory controller generates information indicating whether a command received from the external host is a command requesting access to the access restricted area based on the information on the access restricted area.

15. The storage device of claim 13, wherein the memory controller includes information on the access restricted area within the memory device.

16. The storage device of claim 1, wherein the memory device includes an access restricted area to which access is restricted.

* * * * *